(12) United States Patent
Ema et al.

(10) Patent No.: US 10,991,707 B2
(45) Date of Patent: Apr. 27, 2021

(54) SEMICONDUCTOR DEVICE AND METHOD FOR FABRICATING SEMICONDUCTOR DEVICE

(71) Applicant: UNITED SEMICONDUCTOR JAPAN CO., LTD., Kuwana (JP)

(72) Inventors: Taiji Ema, Inabe (JP); Makoto Yasuda, Kuwana (JP)

(73) Assignee: United Semiconductor Japan Co., Ltd., Kuwana (JP)

( * ) Notice: Subject to any disclaimer, the term of this patent is extended or adjusted under 35 U.S.C. 154(b) by 0 days.

(21) Appl. No.: 16/201,584

(22) Filed: Nov. 27, 2018

(65) Prior Publication Data

US 2019/0237473 A1 Aug. 1, 2019

(30) Foreign Application Priority Data

Jan. 26, 2018 (JP) .............................. JP2018-012004

(51) Int. Cl.
*H01L 29/792* (2006.01)
*H01L 27/06* (2006.01)
(Continued)

(52) U.S. Cl.
CPC ...... *H01L 27/11568* (2013.01); *H01L 21/266* (2013.01); *H01L 21/26513* (2013.01);
(Continued)

(58) Field of Classification Search
CPC .......... H01L 27/11568; H01L 27/1159; H01L 27/11898; H01L 27/11573;
(Continued)

(56) References Cited

U.S. PATENT DOCUMENTS 5,838,041 A 11/1998 Sakagami et al.
6,004,849 A * 12/1999 Gardner ............ H01L 21/28114
257/E21.205
(Continued)

FOREIGN PATENT DOCUMENTS

JP 9-97849 A 4/1997
JP 2003-303904 A 10/2003
(Continued)

OTHER PUBLICATIONS

Arbat et al., "SkyFlash EC Project: Architecture for a 1Mbit S-Flash for Space Applications", IEEE, 2012, pp. 617-620 (4 pages).
(Continued)

*Primary Examiner* — Natalia A Gondarenko
(74) *Attorney, Agent, or Firm* — Winston Hsu

(57) ABSTRACT

A semiconductor device is disclosed. A gate electrode is provided above a semiconductor substrate. A sidewall insulation film is provided to the gate electrode. Source and drain regions are provided in the substrate and contain first conductive impurities. A first semiconductor region is provided in the substrate, is on a source region side, and has a concentration of the first conductive impurities lower than the source region. A second semiconductor region is provided in the substrate, is on a drain region side, and has a concentration of the first conductive impurities lower than the drain and first semiconductor regions. A channel region is provided between the first and second semiconductor regions. A third semiconductor region is provided under the channel region, and includes second conductive impurities higher in concentration than the channel region. Information is stored by accumulating charges in the sidewall insulation film.

15 Claims, 31 Drawing Sheets

(51) Int. Cl.
*H01L 29/66* (2006.01)
*H01L 27/11568* (2017.01)
*H01L 29/78* (2006.01)
*H01L 29/06* (2006.01)
*H01L 27/11573* (2017.01)
*H01L 29/08* (2006.01)
*H01L 29/10* (2006.01)
*H01L 29/423* (2006.01)
*H01L 21/266* (2006.01)
*H01L 21/265* (2006.01)
*H01L 21/28* (2006.01)

(52) U.S. Cl.
CPC .... *H01L 27/11573* (2013.01); *H01L 29/0847* (2013.01); *H01L 29/1083* (2013.01); *H01L 29/40117* (2019.08); *H01L 29/4234* (2013.01); *H01L 29/66492* (2013.01); *H01L 29/66537* (2013.01); *H01L 29/66833* (2013.01); *H01L 29/7833* (2013.01); *H01L 29/792* (2013.01)

(58) Field of Classification Search
CPC ......... H01L 29/40117; H01L 29/41766; H01L 29/792; H01L 29/66537; H01L 29/6659; H01L 29/66659; H01L 29/66575; H01L 29/66598; H01L 29/66492; H01L 21/26513; H01L 21/26506; H01L 21/266; H01L 21/823418; H01L 21/823842–823864; H01L 29/66833; H01L 29/7833–7836; H01L 29/7849; H01L 29/4234; H01L 29/1083; H01L 29/0847; H01L 2027/11831; H01L 2027/11833; H01L 2027/11838; H01L 2027/11861; H01L 29/78624; H01L 29/78618; H01L 29/78621; H01L 27/105; H01L 27/1052; H01L 27/10802; H01L 27/10808; H01L 27/1104; H01L 27/11531; H01L 27/11266; H01L 27/1122; H01L 27/11546; H01L 27/1157; H01L 27/11563; H01L 29/66553; H01L 29/6653; H01L 29/6656; H01L 29/66689; H01L 21/823468
USPC ........ 257/324, 402, 407, 408, E29.255, 336, 257/344, 500; 438/286, 287, 289, 276, 438/238, 302–307
See application file for complete search history.

(56) References Cited

U.S. PATENT DOCUMENTS

| | | | |
|---|---|---|---|
| 6,084,283 A * | 7/2000 | Arai | H01L 21/823814 257/336 |
| 8,163,619 B2 * | 4/2012 | Yang | H01L 21/26513 438/286 |
| 8,941,180 B2 * | 1/2015 | Anderson | H01L 21/823412 257/348 |
| 9,196,727 B2 * | 11/2015 | Thompson | H01L 29/7833 |
| 2003/0185052 A1 | 10/2003 | Yeh et al. | |
| 2003/0222303 A1 | 12/2003 | Fukuda et al. | |
| 2005/0224859 A1 | 10/2005 | Iwata et al. | |
| 2007/0108470 A1 | 5/2007 | Wang et al. | |
| 2007/0108507 A1 | 5/2007 | Wang et al. | |
| 2007/0108508 A1 | 5/2007 | Lin et al. | |
| 2007/0109860 A1 | 5/2007 | Lin et al. | |
| 2007/0109861 A1 | 5/2007 | Wang et al. | |
| 2007/0109869 A1 | 5/2007 | Wang et al. | |
| 2007/0109872 A1 | 5/2007 | Lin et al. | |
| 2007/0111357 A1 | 5/2007 | Wang et al. | |
| 2008/0138956 A1 | 6/2008 | Wang et al. | |
| 2008/0237730 A1 * | 10/2008 | Saeki | H01L 27/105 257/369 |
| 2008/0293199 A1 | 11/2008 | Lin et al. | |
| 2014/0248753 A1 * | 9/2014 | Shifren | H01L 29/66659 438/286 |
| 2015/0021732 A1 | 1/2015 | Kanai et al. | |
| 2015/0200191 A1 | 7/2015 | Matsuura et al. | |
| 2016/0284720 A1 | 9/2016 | Ema et al. | |
| 2017/0309561 A1 | 10/2017 | Ema et al. | |
| 2019/0363195 A1 * | 11/2019 | Ema | H01L 29/792 |

FOREIGN PATENT DOCUMENTS

| | | |
|---|---|---|
| JP | 2003-332474 A | 11/2003 |
| JP | 2004-56095 A | 2/2004 |
| JP | 2007-142398 A | 6/2007 |
| JP | 2016-184721 A | 10/2016 |

OTHER PUBLICATIONS

Fujita et al., "Advanced Channel Engineering Achieving Aggressive Reduction of VT Variation for Ultra-Low-Power Applications", IEEE, 2011, pp. 749-752 (4 pages).
Clark et al., "A Highly Integrated 65-nm SoC Process with Enhanced Power/Performance of Digital and Analog Circuits", IEEE, 2012, pp. 335-338 (4 pages).
Patel et al., "A 55nm Ultra Low Leakage Deeply Depleted Channel Technology Optimized for Energy Minimization in Subthreshold SRAM and Logic" IEEE, 2016, pp. 37-40 (4 pages).
Zeng et al., "A 1.7nW PLL-Assisted Current Injected 32KHz Crystal Oscillator for IoT", Symposium on VLSI Circuits, 2017, pp. 68-69 (2 pages).
Hori et al., "Embedded FLOTOX Flash on Ultra-Low Power 55nm Logic DDC Platform", IEEE, 2013, pp. 244-247 (4 pages).
Fukuda et al., "Scaled 2 bit/cell SONOS Type Nonvolatile Memory Technology for sub-90nm Embedded Application using SiN Sidewall Trapping Structure", IEEE, 2003, pp. 909-912 (4 pages).
Nair et al., "Drain Disturb During CHISEL Programming of NOR Flash EEPROMs—Physical Mechanisms and Impact of Technological Parameters", IEEE Transactions on Electron Devices, May 2004, vol. 51, No. 5, pp. 701-707 (7 pages).
Non-Final Office Action dated Jan. 2, 2020, issued in U.S. Appl. No. 16/273,534 (10 pages).

* cited by examiner

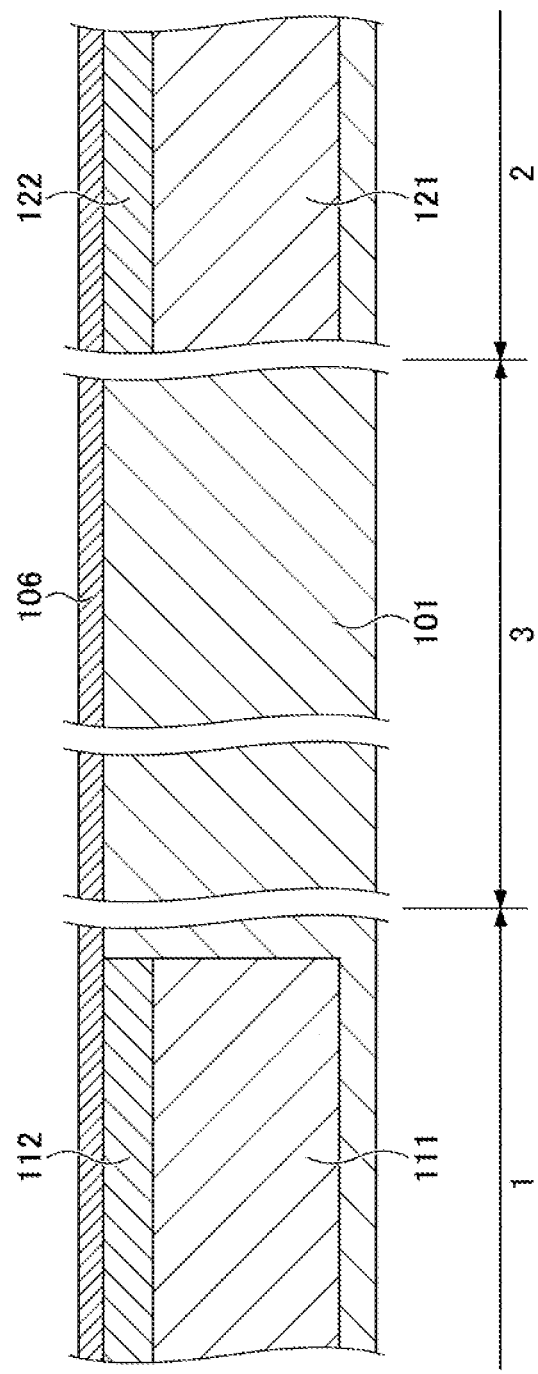

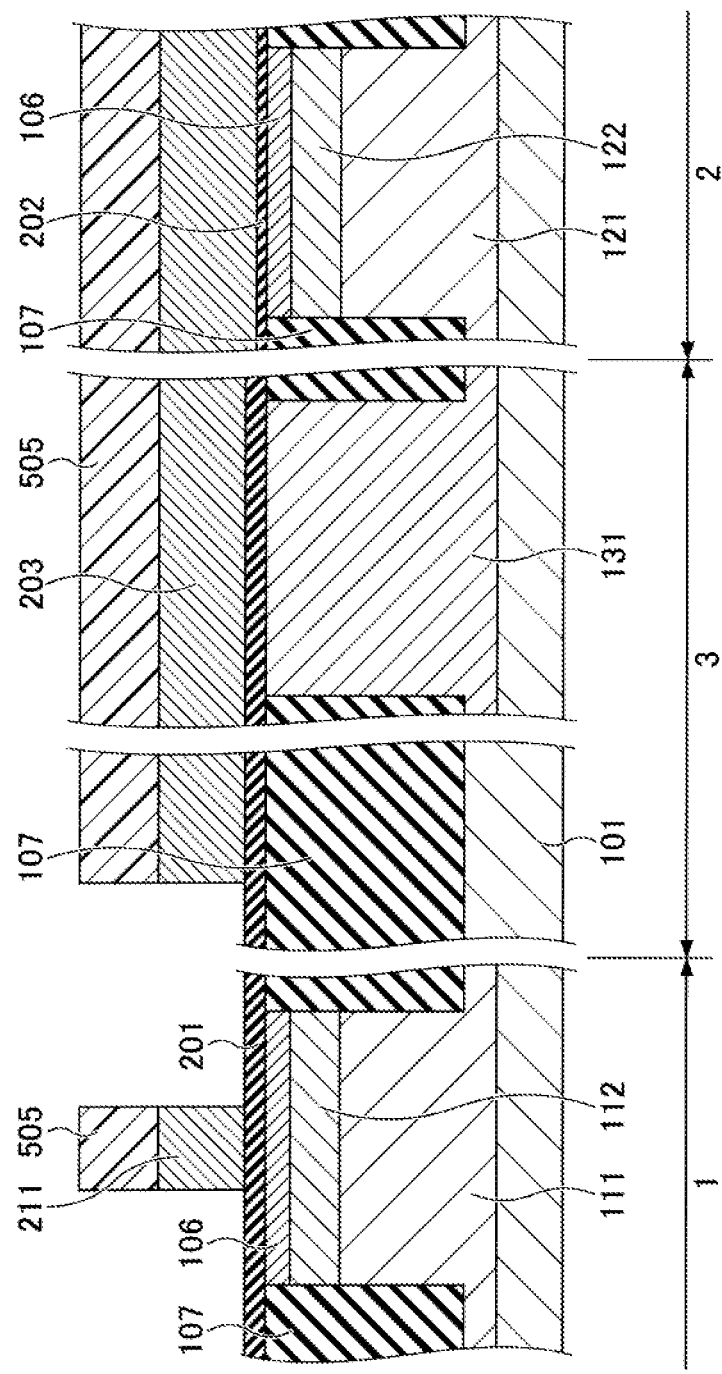

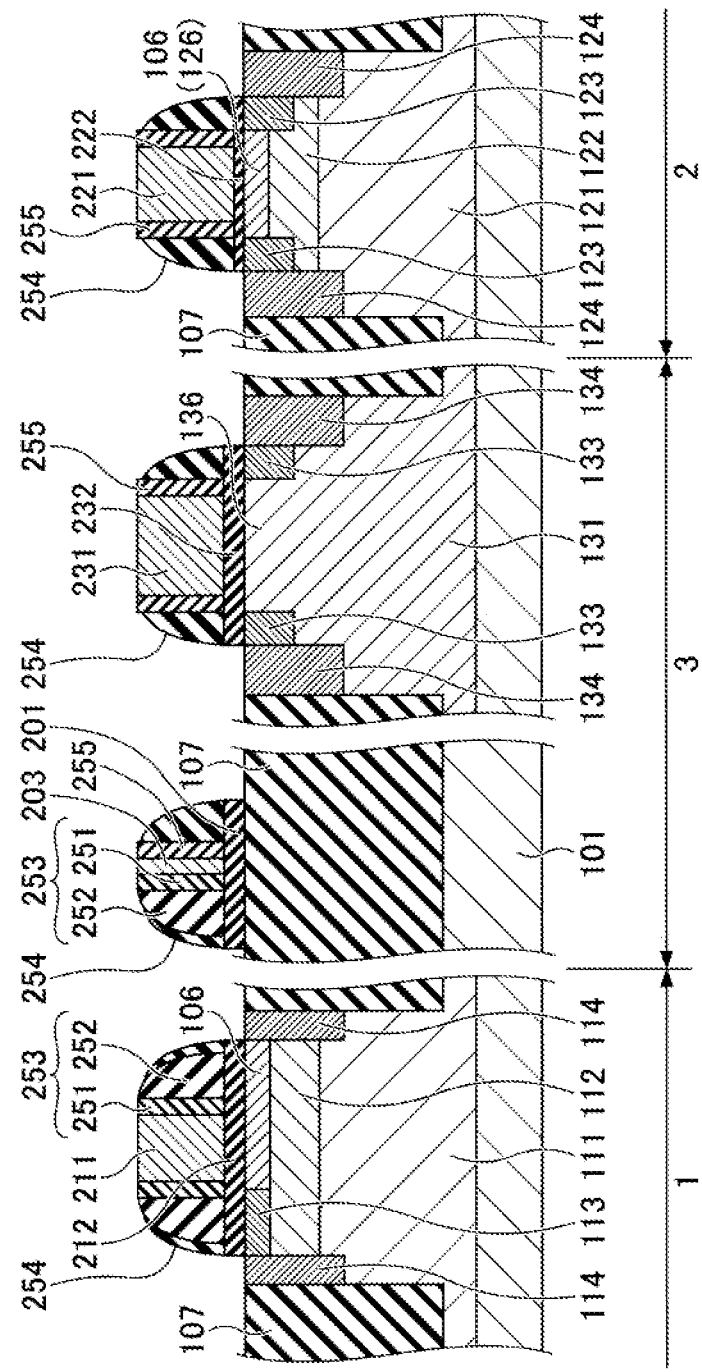

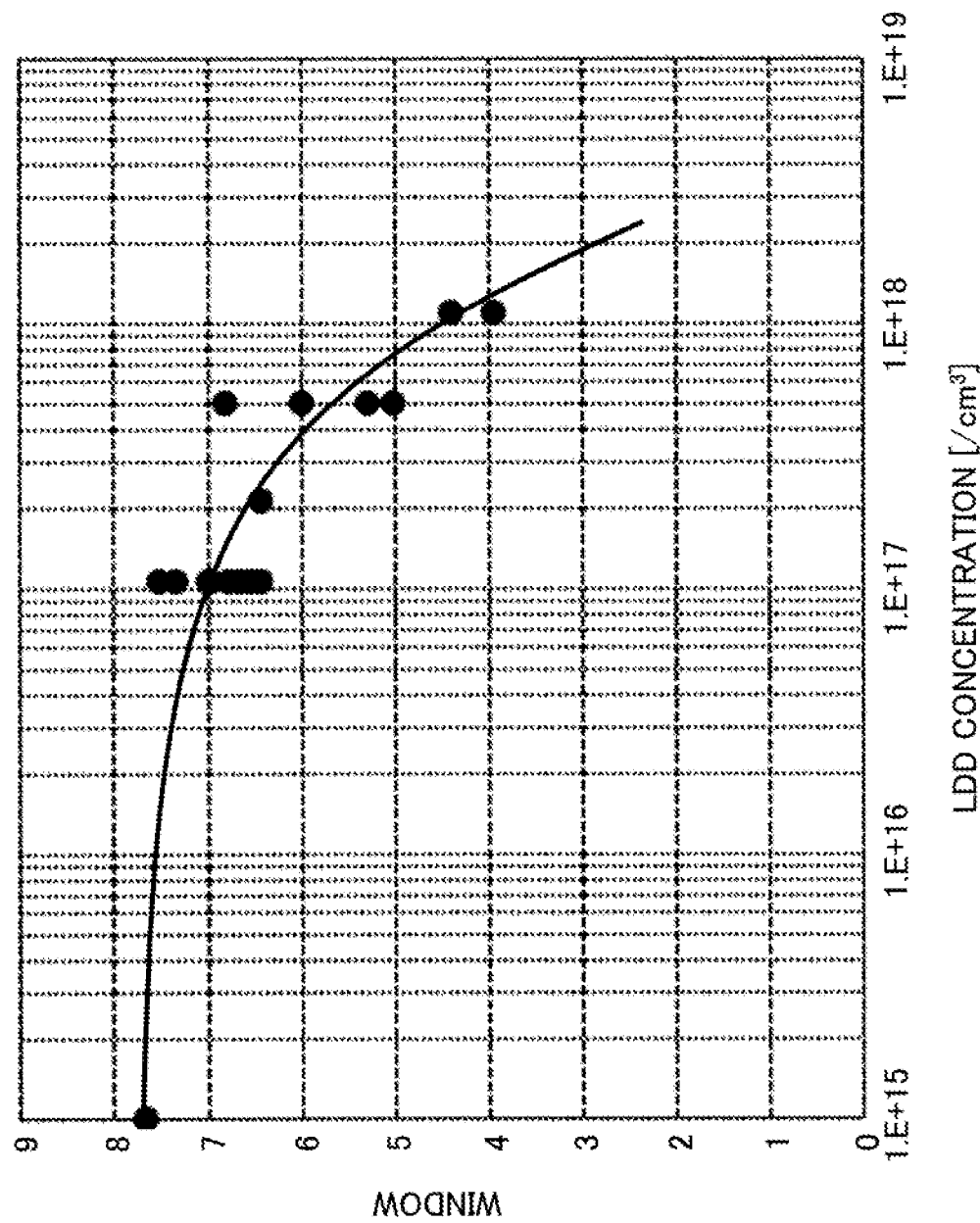

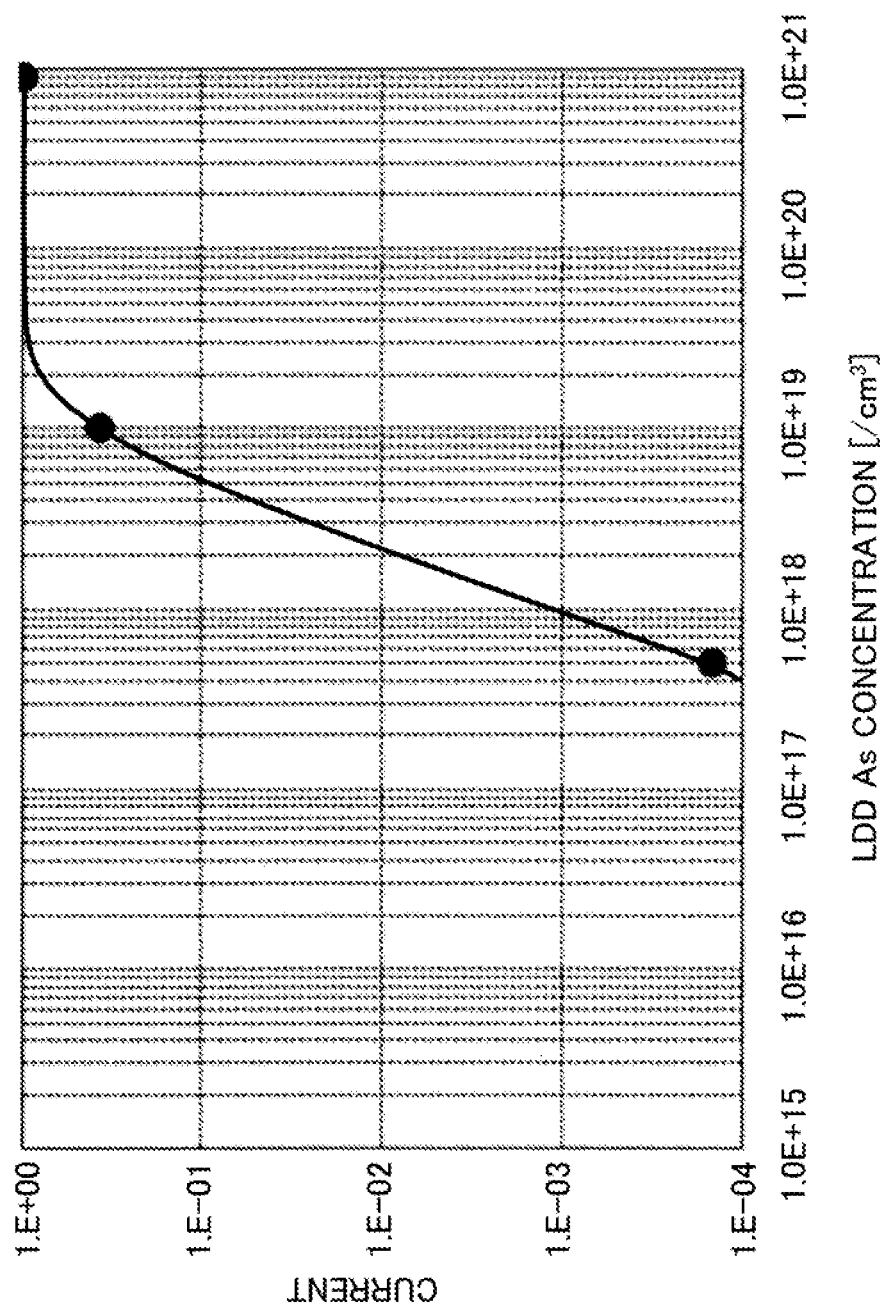

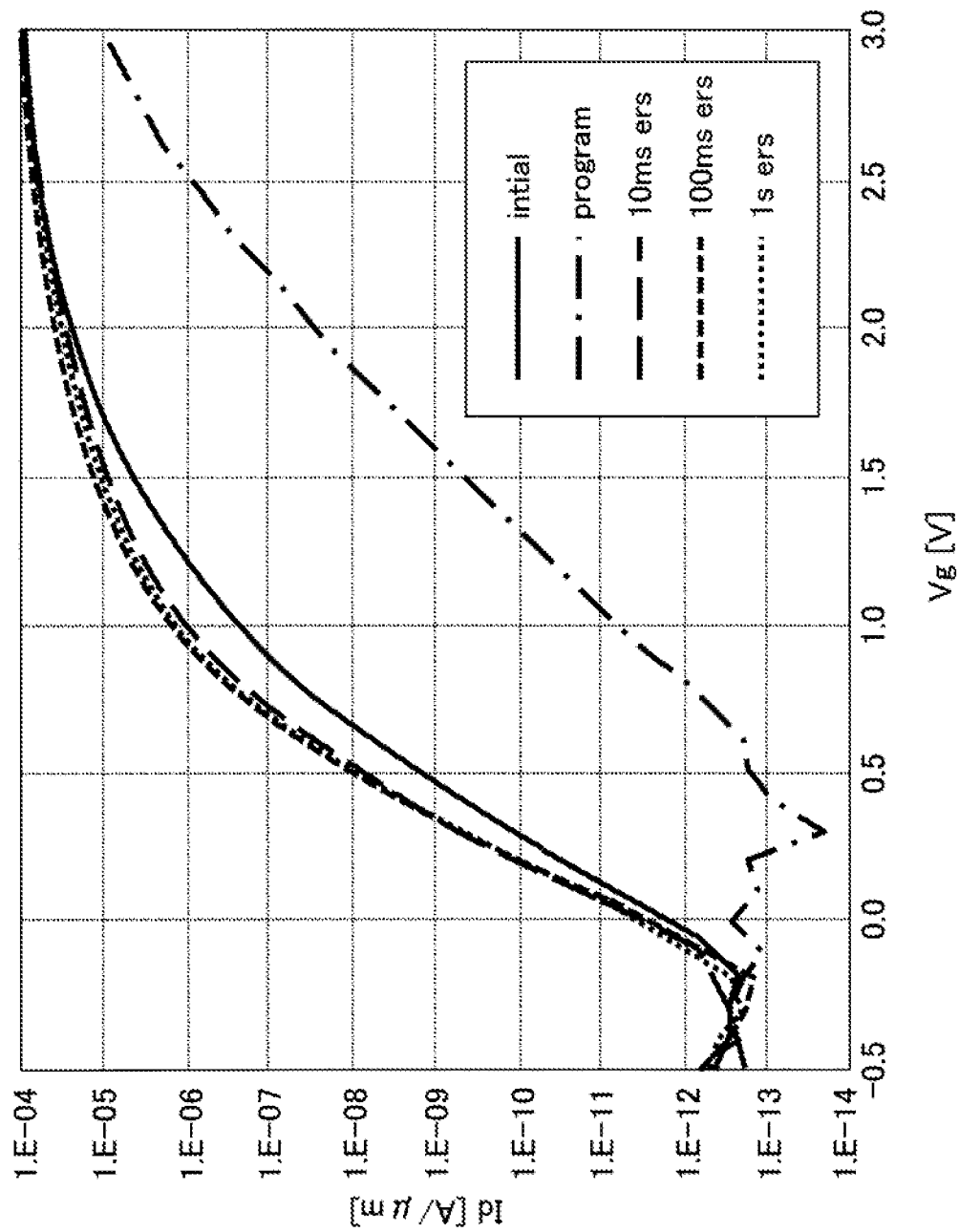

SEMICONDUCTOR DEVICE AND METHOD FOR FABRICATING SEMICONDUCTOR DEVICE

CROSS-REFERENCE TO RELATED APPLICATIONS

This application is based upon and claims the benefit of priority of the prior Japanese Patent Application No. 2018-012004, filed on Jan. 26, 2018, the entire contents of which are incorporated herein by reference.

FIELD

The embodiments discussed herein are related to a semiconductor device and a method for fabricating a semiconductor device.

BACKGROUND

One type of semiconductor devices is a non-volatile memory. For instance, a non-volatile memory is known, in which a Metal Oxide Semiconductor (MOS) type field effect transistor is included to store information by accumulating charges (hot carriers) in a sidewall insulation film on a sidewall of a gate electrode as a memory transistor.

In the non-volatile memory including a memory transistor group that stores information by accumulating the hot carriers in the sidewall insulation film, a program speed of the entire non-volatile memory depends on a program speed of each of memory transistors. If the program speed of each of memory transistors is not sufficient, depending on the capacity of the non-volatile memory, a predetermined program is not executed within a time allowed on a system including the non-volatile memory.

Therefore, Patent Document 1 proposes a semiconductor device, in which the program speed of a memory transistor is improved. According to this semiconductor device, it is possible to achieve an intended purpose.

However, it is desired to improve an endurance of a program operation and an erase operation by multiple cycles with respect to the non-volatile memory. According to the semiconductor device described in Patent Document 1, an excellent endurance is obtained as compared with conventional semiconductor devices; however, it may be difficult to obtain a sufficient endurance to meet recent demands.

Patent Documents

[Patent Document 1]
Japanese Laic-open Patent Publication No. 2016-184721

SUMMARY

According to one aspect of the embodiments, a semiconductor device includes a gate insulation film provided above a semiconductor substrate; a gate electrode provided above the gate insulation film; a sidewall insulation film provided on each of sidewalls of the gate electrode and above the semiconductor substrate; a source region and a drain region provided in the semiconductor substrate on both sides of the gate electrode, respectively, the source region and the drain region containing first conductive impurities; a first semiconductor region provided in the semiconductor substrate below a first portion of the sidewall insulation film, a location of the first portion being on a source region side with respect to the gate electrode, the first semiconductor region having a concentration of the first conductive impurities lower than that of the source region; a second semiconductor region provided in the semiconductor substrate below a second portion of the sidewall insulation film, a location of the second portion being on a drain region side with respect to the gate electrode, the second semiconductor region having a concentration of the first conductive impurities lower than those of the drain region and the first semiconductor region; a channel region provided in the semiconductor substrate between the first semiconductor region and the second semiconductor region; and a third semiconductor region provided in the semiconductor substrate under the channel region and including second conductive impurities, which are higher in concentration than the channel region and are different from the first conductive impurities, wherein information is stored by accumulating charges in the sidewall insulation film.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3A to FIG. 3M are cross-sectional views illustrating a method of fabricating the semiconductor device according to the first embodiment in an order of steps;

FIG. 12A and FIG. 12B are a cross-sectional views illustrating a modification example of a method of fabricating the semiconductor device according to the first embodiment;

FIG. 13 is a graph illustrating a relationship between a relationship between an impurity concentration and a variation;

FIG. 14 is a graph illustrating a relationship between a relationship between the impurity concentration and a current;

FIG. 16 is a graph illustrating a relationship between a gate voltage and a read current in a case in which impurities are As; and FIG. 17 is a graph illustrating a relationship between a gate voltage and a read current in a case in which impurities are P.

DESCRIPTION OF EMBODIMENTS

The inventors have made intensive studies to obtain a sufficient endurance to a program operation and an erase operation by multiple cycles desired for a non-volatile memory of a product. Consequently, with respect to two Lightly Doped Drain (LDD) regions conventionally provided between a source region and a drain region, it has been found that it is effective to make an impurity concentration of one LDD region on the source region side higher than another LDD region on the drain region side. Details will be described later. Moreover, it has been found that there is also a preferable range for the impurity concentration; for instance, it is preferable to make non-doping for the region on the drain region side, instead of introducing impurities.

Embodiments of the present invention will be described with reference to the accompanying drawings. The embodiments described below will provide a semiconductor device capable of obtaining an excellent endurance with respect to a program operation and an erase operation.

First Embodiment

Figure 1:
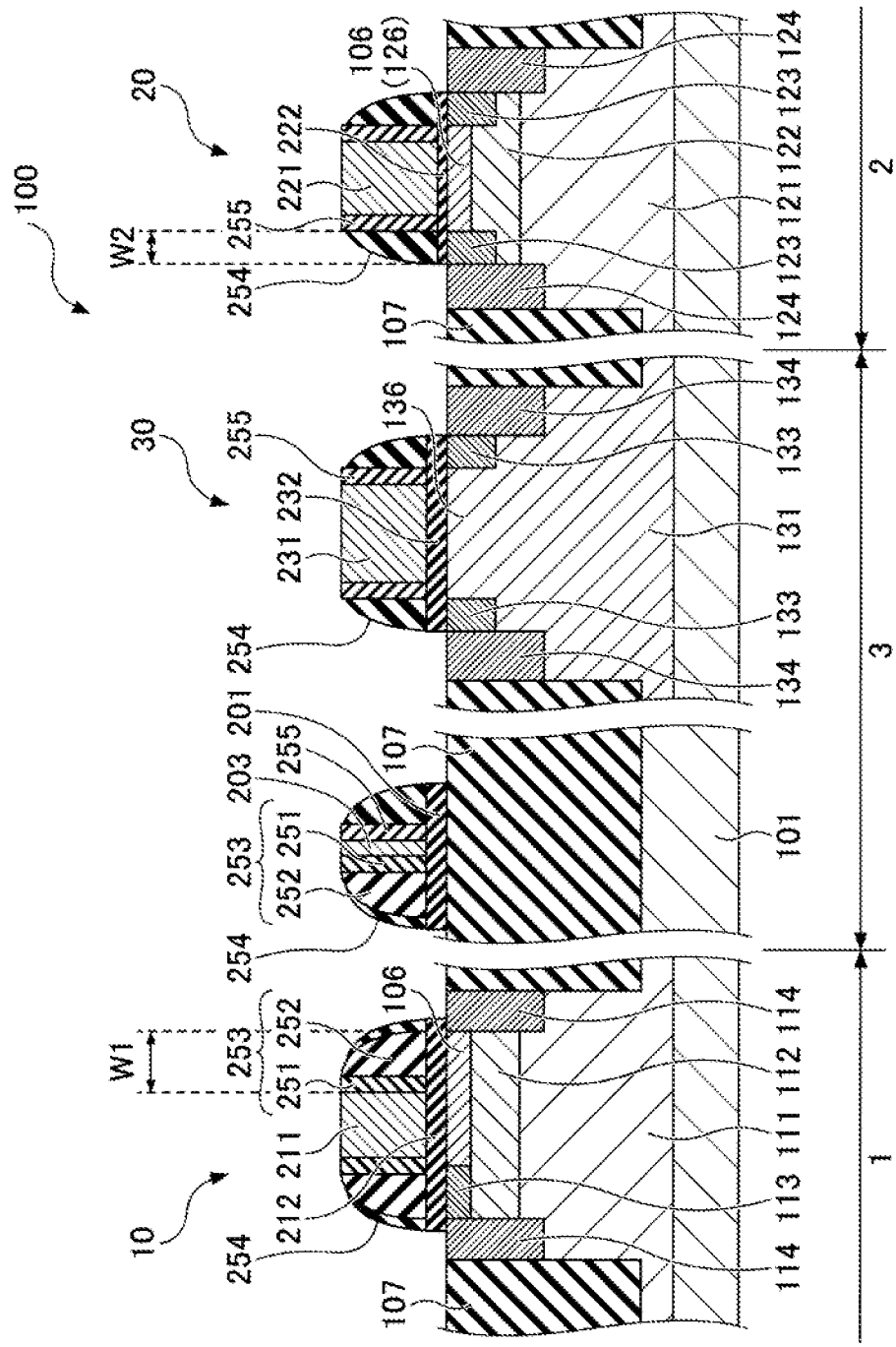
FIG. 1 is a sectional view illustrating a semiconductor device according to a first embodiment.

First, a first embodiment will be described. FIG. 1 is a sectional view illustrating a semiconductor device according to the first embodiment.

A semiconductor device 100 according to the first embodiment is an example of a non-volatile memory, and includes a transistor (memory transistor) 10 provided in a memory region 1, a transistor (logic transistor) 20 provided in a logic region 2, and a transistor (I/O transistor) 30 provided in an input/output (I/O) region 3.

The memory transistor 10, the logic transistor 20, and the I/O transistor 30 are formed (mixed and mounted) on a semiconductor substrate 101, which is a p-type or n-type substrate in common for these transistors 10, 20, and 30. As the semiconductor substrate 101, any one of various types of substrates made from silicon (Si), silicon germanium (SiGe), and the like may be used.

A region (element region) where the memory transistor 10 is formed, a region (element region) where the logic transistor 20 is formed, and a region (element region; where the I/O transistor 30 is formed are defined by element isolation regions 107, which are formed on the semiconductor substrate 101 by using a Shallow Trench Isolation (STI) method, a thermal oxidation method, or the like.

One memory transistor 10 is illustrated in FIG. 1; however, a plurality of the memory transistors 10 or at least one memory transistor 10, and other memory transistors may be included in the memory region 1 of the semiconductor device 100.

One logic transistor 20 is illustrated in FIG. 1; however, a plurality of the logic transistors 20 or at least one logic transistor 20, and other logic transistors may be included in the logic region 2 of the semiconductor device 100.

One I/O transistor 30 is illustrated in FIG. 1; however, a plurality of the I/O transistors 30 or at least one I/O transistor 30, and other I/O transistors may be included in the I/O region 3 of the semiconductor device 100.

Figure 2:
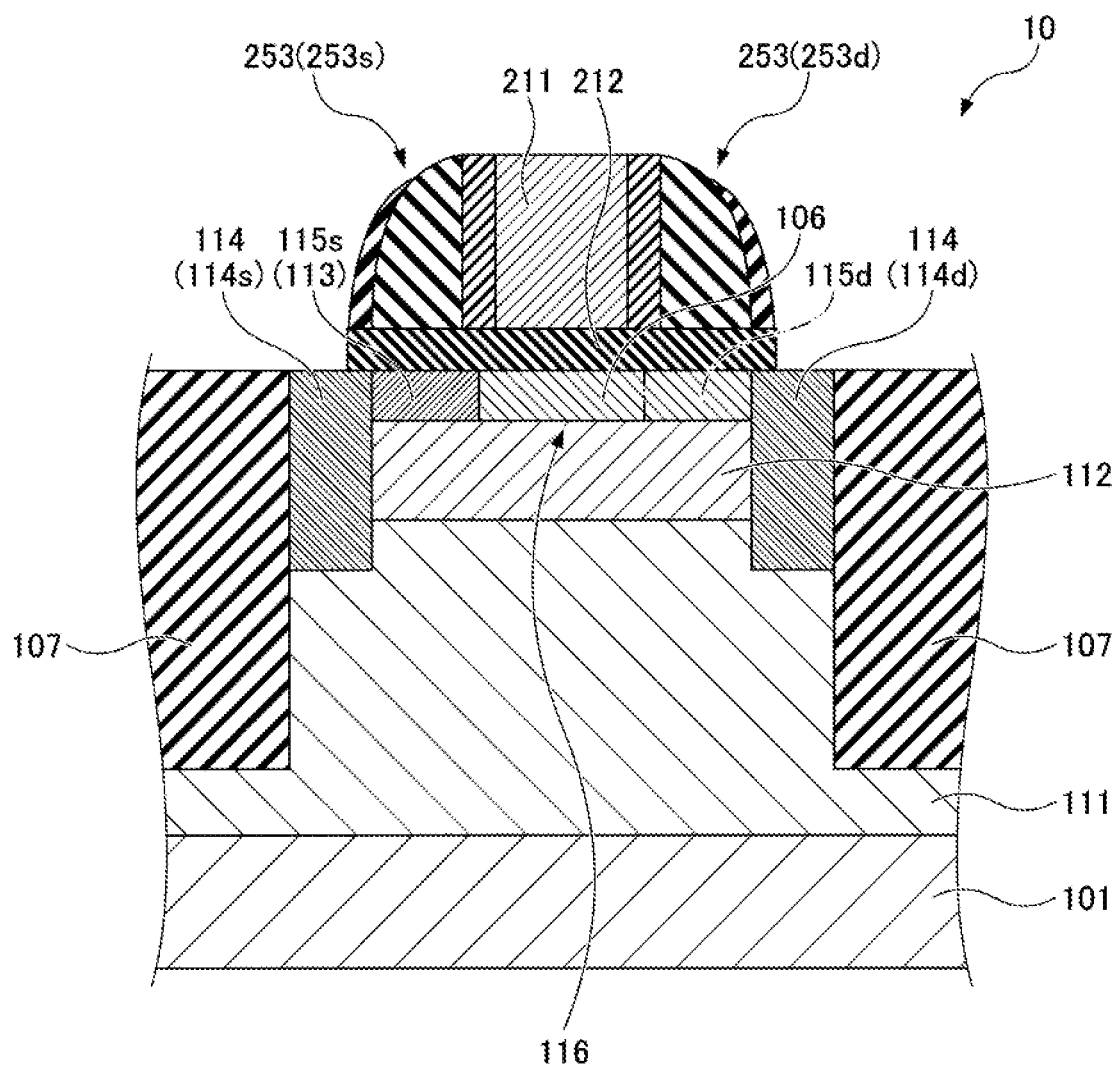
FIG. 2 is a sectional view illustrating a memory transistor in detail.

FIG. 2 is a sectional view illustrating the memory transistor 10 in detail. As illustrated in FIG. 1 and FIG. 2, the memory transistor 10 includes a gate insulation film 212 provided above the semiconductor substrate 101, a gate electrode 211 provided above the gate insulation film 212, and a sidewall insulation film 253 provided at a sidewall of the gate electrode 211 above the semiconductor substrate 101.

The memory transistor 10 further includes impurity regions 114 of a first conductive (a source region 114s and a drain region 114d), which are provided respectively at both sides of the gate electrode 211 (both sides in a gate length direction) in the semiconductor substrate 101 and function as a source region and a drain region. The memory transistor 10 includes a first semiconductor region 115s, which is provided below a first portion 253s of the sidewall insulation film 253 located on the source region 114s side with respect to the gate electrode 211 in the semiconductor substrate 101 and contains impurities of the first conductivity type (hereinafter, referred to as "first conductive impurities") with a concentration lower than the source region 114s.

The memory transistor 10 includes a second semiconductor region 115d, which is provided below a second portion 253d of the sidewall insulation film 253 located on the dram region 114d side with respect to the gate electrode 211 in the semiconductor substrate 101, and contains the first conductive impurities with a concentration lower than the drain region 114d and the first semiconductor region 115s.

For instance, the first semiconductor region 115s is an LDD region, and the second semiconductor region 115d is a non-doped region. The second semiconductor region 115d may be the LDD region.

For the gate insulation film 212, various insulation materials may be used such as silicon oxide ($SiO_2$), silicon nitride ($Si_3N_4$), hafnium oxide ($HfO_2$) and the like. For instance, a thickness of the gate insulation film 212 may be set based on a threshold voltage to be set for the memory transistor 10.

For the gate electrode 211, other than polycrystailine silicon (polysilicon), a metal such as titanium (Ti), tungsten (W), or nitrides thereof may be used.

For instance, the sidewall insulation film 253 may include a structure in which an oxide film 251 being an insulation film and a nitride film 252 are layered. For instance, silicon oxide may be used for the oxide film 251. For instance, the gate insulation film 212 extends as it is on the semiconductor substrate 101 and an oxide film formed by thermal oxidation of the gate electrode 211 is provided on a side surface of the gate electrode 211. Hence, as a whole, the oxide film 251 in an L-shaped cross-section and a gate insulation film 212 are provided on each of the sidewalls of the gate electrode 211 and the semiconductor substrate 101. The nitride film 252 is provided on the oxide film 251 and the gate insulation film 212.

FIG. 1 exemplifies the sidewall insulation film 253 having a two-layer structure of the oxide film 251 and a nitride film 252, and the gate insulation film 212. Alternately, the sidewall insulation film 253 may have a three-layer structure of an oxide film in the L-shaped cross-section, a nitride film, and an oxide film further formed on an insulation film, or may have a layered structure of four or more insulation films. The sidewall insulation film 253 may have a single-layer structure of an oxide film or a nitride film. For instance, the sidewall insulation film 253 may be provided so that a width (thickness) W1 of the gate electrode 211 in the gate length direction (planar direction of the semiconductor substrate 101) is wider than a width (thickness) W2 of the sidewall insulation film 254 of the logic transistor 20. The sidewall insulation film 254 will be descried later.

In the impurity regions 114, impurities of a predetermined conductivity type, that is, n-type impurities such as phosphorus (P), arsenic (As), or the like, or p-type impurities such as boron (B) or the like, are included at a predetermined concentration.

In the memory transistor 10, a region between the first semiconductor region 115$s$ and the second semiconductor region 115$d$ below the gate electrode 211 functions as a channel region 116, in which carriers (electrons or holes) move. The second semiconductor region 115$d$ may sometimes function as a part of the channel region.

The memory transistor 10 has a third semiconductor region 112 provided under the channel region 116. The third semiconductor region 112 is a region containing impurities of a higher concentration than the channel region 116. The third semiconductor region 112 is also referred to as a screen layer (SCR layer).

The third semiconductor region 112 contains, at a predetermined concentration, impurities of a conductivity type different from impurities contained in the source region 114$s$ and the drain region 114$d$. A threshold voltage of the memory transistor 10 is controlled by the impurity concentration of the third semiconductor region 112. In addition, punch-through between the source region 114$s$ and the drain region 114$d$ is suppressed by the third semiconductor region 112. The third semiconductor region 112 is provided at a position, which is embedded in the semiconductor substrate 101 and which corresponds to the thickness of the channel region 116 iron an interface between the semiconductor substrate 101 and the gate insulation film 212, and the threshold voltage is adjusted with the impurity concentration. Hence, for instance, the impurity concentration is set to a comparatively high impurity concentration of approximately $1 \times 10^{19}$ cm$^{-3}$.

The concentration of impurities of the second conductivity type (hereinafter, referred to as "second conductive impurities") in the third semiconductor region 112 is preferably lower than the concentration of the first conductive impurities in the first semiconductor region 115$s$ and higher than the concentration of the first conductive impurities in the second semiconductor region 115$d$. It is more preferable that the concentration of the first conductive impurities in the second semiconductor region 115$d$ is one tenth (1/10) or less than the concentration of the second conductive impurities in the third semiconductor region 112.

The memory transistor 10 is a non-volatile memory transistor that stores information by accumulating charges (electrons or holes) in the sidewall insulation film 253. In the memory transistor 10 having the gate insulation film 212 and the sidewall insulation film 253 including a layered structure of the oxide film 251 and the nitride film 252, charge is mainly accumulated in the nitride film 252. The nitride film 252 such as silicon nitride has a charge trapping level, and also, the oxide film 251 such as silicon oxide and the gate insulation film 212 suppresses dissipation of the charge accumulated in the nitride film 252.

As illustrated in FIG. 1, the logic transistor 20 includes a gate insulation film 222 provided above the semiconductor substrate 101, a gate electrode 221 provided above the gate insulation film 222, and the sidewall insulation film 254 provided on the sidewall of the gate electrode 221 and above the semiconductor substrate 101. The logic transistor 20 further includes two impurity regions 124, which are provided in the semiconductor substrate 101 on both sides (both sides in the gate length direction) of the gate electrode 221 and function as a source region or a drain region. Moreover, the logic transistor 20 may include LDD regions 123 inside with respect to the two impurity regions 124 within the semiconductor substrate 101 below the sidewall insulation films 254.

As the gate insulation film 222, any one of various insulation materials such as silicon oxide, silicon nitride, hafnium oxide, or the like may be used. For instance, the film thickness of the gate insulation film 222 may be set based on the threshold voltage set for the logic transistor 20, and the gate insulation film 222 may be thinner than the gate insulation film 212.

As the gate electrode 221, other than polysilicon, a metal such as titanium or a nitride thereof may be used.

The sidewall insulation film 254 includes an oxide film such as silicon oxide or a nitride film such as silicon nitride. The sidewall insulation film 254 does not necessarily need to include the layered structure of an oxide film and a nitride film and may have a single layer structure of an insulation film such as an oxide film or a nitride film. The sidewall insulation film 254 may be provided so that a width W2 of the gate electrode 221 in the gate length direction (planar direction of the semiconductor substrate 101) is shorter than the width W1 of the sidewall insulation film 253 of the memory transistor 10.

The impurity regions 124 contain n-type or p-type conductivity impurities at a predetermined concentration. The LDD regions 123 contain impurities being the same conductivity type as that of the impurities contained in the impurity regions 124, at a concentration lower than that of the impurity region 124.

In the logic transistor 20, a region between the two LDD regions 123 below the gate electrode 221 functions as a channel region 128, in which carriers (electrons or holes) move.

The logic transistor 20 has a relatively high concentration semiconductor region 122 provided below the channel region 126. The semiconductor region 122 contributes to reduction in variations in the threshold voltage, reduction in power consumption, and the like at the logic transistor 20.

For instance, the logic transistor 20 in a logic region 2 is used for reading the memory transistor 10 in the memory region 1.

As illustrated in FIG. 1, the I/O transistor 30 includes a gate insulation film 232 provided above the semiconductor substrate 101, a gate electrode 231 provided above the gate insulation film 232, and sidewalls insulation films 254 provided on the sidewall of the gate electrode 231 and above the semiconductor substrate 101. The I/O transistor 30 further includes two impurity regions 134, which are provided in the semiconductor substrate 101 on both sides (both sides in the gate length direction) of the gate electrode 231 and function as a source region or a drain region. Moreover, the I/O transistor 30 may include LDD regions 133 inside with respect to the two impurity regions 134 in the semiconductor substrate 101 below the sidewall insulation films 254.

As the gate insulation film 232, any one of various insulation materials such as silicon oxide, silicon nitride, hafnium oxide and the like may be used. For instance, a film thickness of the gate insulation film 232 may be set on the basis of the threshold voltage set for the I/O transistor 30, and may be approximately the same as the film thickness of the gate insulation film 212.

As the gate electrode 231, other than polysilicon, a metal such as titanium or a nitride thereof may be used.

The impurity regions 134 contain n-type or p-type conductivity impurities at a predetermined concentration. The LDD regions 133 contain impurities being the same conductivity type as that of the impurities contained in the impurity regions 134 at a concentration lower than that of the impurity regions 134.

In the I/O transistor 30, a region between the two LDD regions 133 below the gate electrode 231 functions as a channel region 136 in which carriers (electrons or holes) move. For instance, the I/O transistor 30 is used for programming (writing) and erasing information in the memory transistor 10 in the memory region 1.

Next, each of the program operation and the read operation in the memory transistor 10 will be described. Here, memory transistor 10 is an n-channel type, the semiconductor substrate 101 is a p-type, the source regions 114s, the drain region 114d, and the first semiconductor region 115s (LDD region 113) are an n-type, and the second semiconductor region 115d is an i-type.

Each node of the gate electrode 211, the source region 114s, the drain region 114d, and the semiconductor substrate 101 is set to predetermined potentials to generate hot carriers, and the generated hot carriers are injected and accumulated (held) in the sidewall insulation film 253, so that the program operation is conducted. For instance, the source region 114s and the semiconductor substrate 101 are grounded, and a positive voltage is applied to the gate electrode 211 and the drain region 114d. A negative voltage may be applied to the semiconductor substrate 101.

In a case in which the potential is adjusted in this manner, in the memory transistor 10, an inversion layer (not illustrated) is formed in the channel region 116, and electrons flow from the source region 114s to the drain region 114d in the channel region 116. In a vicinity of the drain region 114d, electrons flowing toward the drain region 114d in the channel region 116 are brought into a high energy state by an electric field generated by the positive voltage applied to the drain region 114d, so that hot electrons are generated. The hot electrons generated in the vicinity of the drain region 114d are injected and accumulated in the second portion 253d by an electric field generated by the positive voltage applied to the gate electrode 211.

For instance, the read operation is conducted by grounding the drain region 114d and the semiconductor substrate 101 and applying a positive voltage to the gate electrode 211 and the source region 114s. The positive voltage applied to the gate electrode 211 is set relatively high in order to obtain a large read current, and the positive voltage applied to the source region 114s is set low to reduce read disturb and to keep the current consumption low.

If electrons are injected and accumulated in the second portion 253d, a potential of the second semiconductor region 115d with respect to electrons increases, and as a result, a resistance of the second semiconductor region 115d increases. Therefore, the current flowing from the source region 114s to the drain region 114d decreases. If the electrons are not injected and accumulated in the second portion 253d, the resistance of the second semiconductor region 115d does not become high and the current flowing from the source region 114s to the drain region 114d does not decrease. In this manner, a presence or an absence ("0" or "1") of the electrons in the second portion 253d is read by the current flowing from the source region 114s to the drain region 114d.

In a case in which the memory transistor 10 is the p-channel type, the semiconductor substrate 101 is the n-type, and the source region 114s, the drain region 114d, and the first semiconductor region 115s (the LDD region 113) are the p-type.

For instance, in the memory transistor 10 of the p-channel type, holes are injected and accumulated in the second portion 253d by applying voltages having opposite polarities to those in the above program operation to each of the nodes. Also, for instance, in the memory transistor 10 of the p-channel type, the presence or absence of the holes in the second portion 253d is read out by applying voltages of opposite polarities to those in the above read operation to each node.

In the semiconductor device 100 according to the first embodiment, because the impurity concentration of the first semiconductor region 115s is higher than that of the impurity region of the second semiconductor region 115d, it is possible to obtain more excellent endurance.

Next, a method of fabricating the semiconductor device 100 according to the first embodiment will be described. FIG. 3A to FIG. 3M are cross-sectional views illustrating a method of fabricating the semiconductor device 100 according to the first embodiment in an order of steps.

Figure 3A:
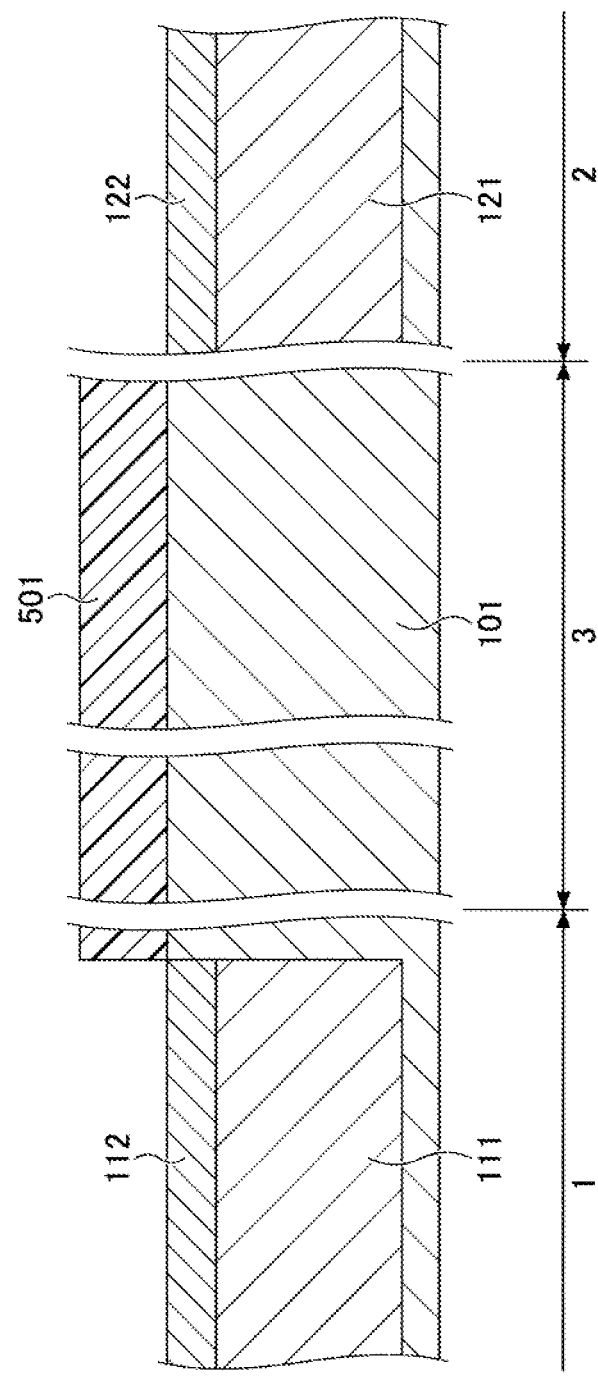

First, as illustrated in FIG. 3A, a resist pattern 501 is formed on the semiconductor substrate 101. The resist pattern 501 exposes the memory region 1 and the logic region 2, and covers the I/O region 3. Subsequently, by implanting impurities using the resist pattern 501 as a mask, the p-well 111 and the third semiconductor region 112 of the p-type are formed in the memory region 1, and the p-well 121 and the semiconductor region 122 of the p-type are formed in the logic region 2. Before forming the resist pattern 501, an alignment mark may be formed, or a silicon oxide film may be formed as a protective film.

For instance, this impurity implantation is performed under the following conditions. Boron is implanted under a condition of an acceleration energy of 135 keV and a dose of approximately $3.5 \times 10^{13}$ to $4.5 \times 10^{13}$ cm$^{-2}$. Germanium is implanted under a condition of an acceleration energy of 30 keV and a dose of approximately $4.5 \times 10^{14}$ to $5.5 \times 10^{14}$ cm$^{-2}$. Carbon is implanted under a condition of an acceleration energy of 5 keV and a dose of $4.5 \times 10^{14}$ to $5.5 \times 10^{14}$ cm$^{-2}$. Boron is implanted under a condition of an acceleration energy of 20 keV and a dose of approximately $6 \times 10^{12}$ to $8 \times 10^{12}$ cm$^{-2}$. Boron fluoride is implanted under a condition of an acceleration energy of 10 keV and a dose of approximately $2.5 \times 10^{12}$ to $3.5 \times 10^{12}$ cm$^{-2}$. Note that it is possible to suppress diffusion of p-type impurities contained in the semiconductor regions 112 and 122 into regions below and above by implanting germanium and carbon.

Figure 3B:
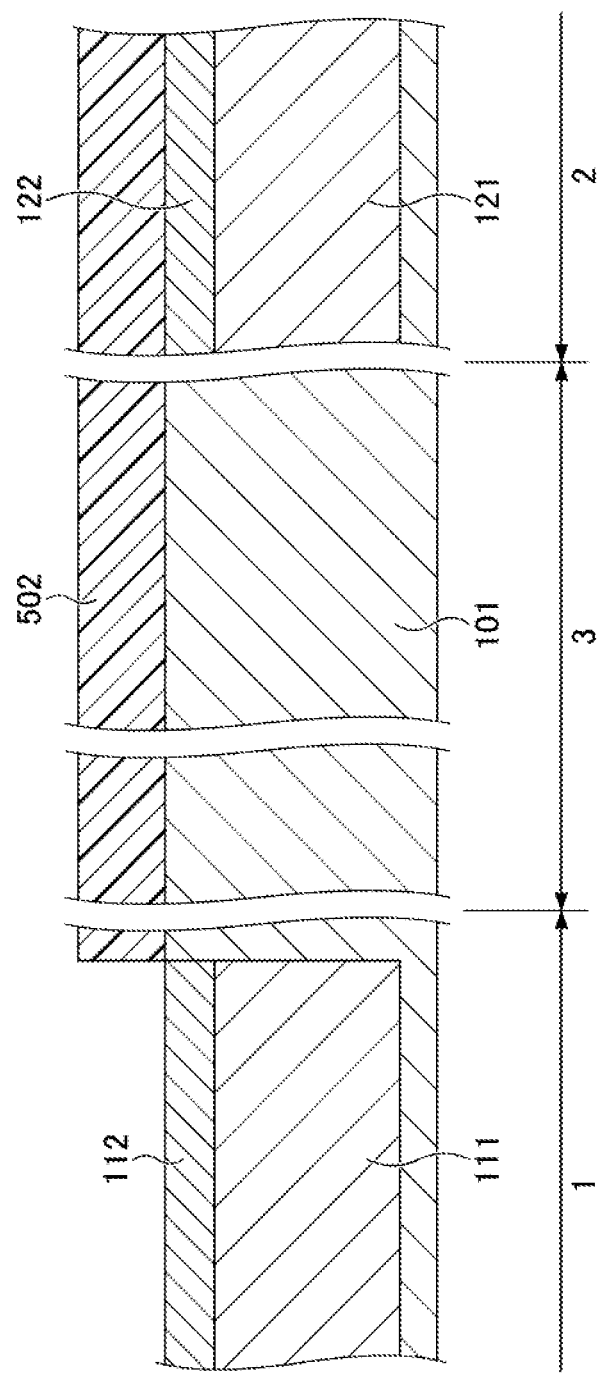

Next, as illustrated in FIG. 3B, the resist pattern 501 is removed, and a resist pattern 502 is formed on the semiconductor substrate 101. The resist pattern 502 exposes the memory region 1 and covers the logic region 2 and the I/O region 3. Subsequently, impurities are implanted using the resist pattern 502 as a mask, so as to increase an impurity concentration of the third semiconductor region 112. For instance, in this implantation of the impurities, boron is implanted under a condition of an acceleration energy of 20 keV and a dose of $1 \times 10^{13}$ to $2 \times 10^{13}$ cm$^{-2}$.

Figure 3C:
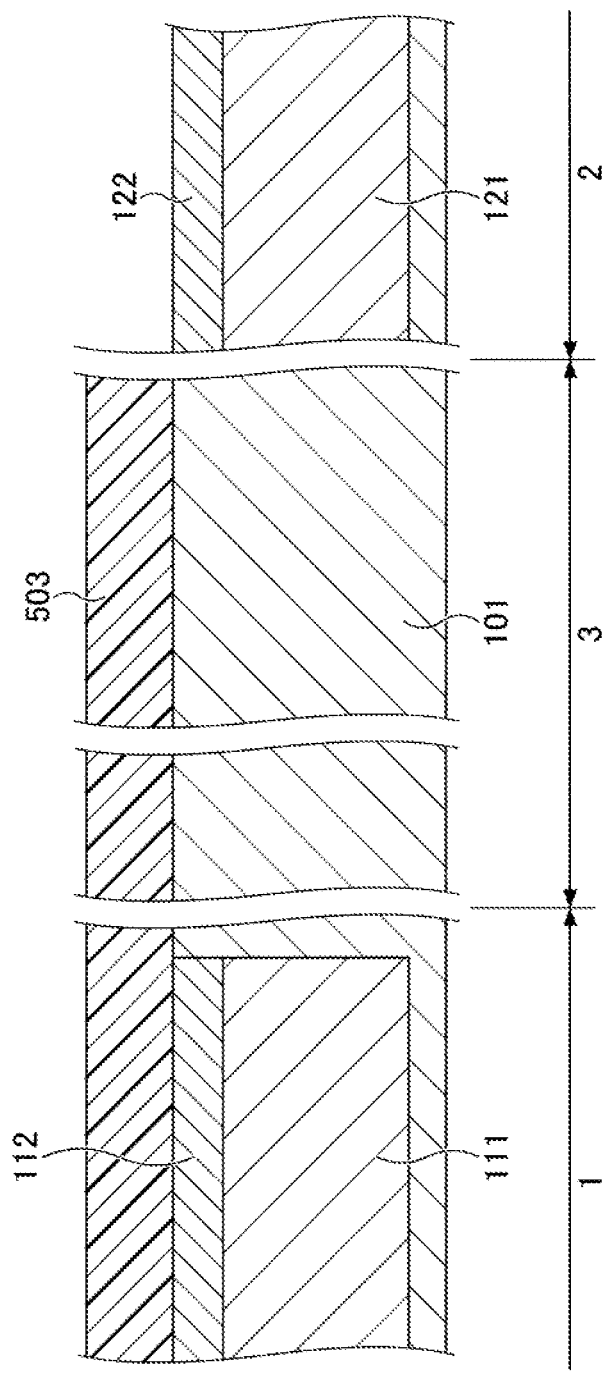

Next, as illustrated in FIG. 3C, the resist pattern 502 is removed, and a resist pattern 503 is formed on the semiconductor substrate 101. The resist pattern 503 exposes the logic region 2 and covers the memory region 1 and the I/O region 3. Thereafter, impurities are implanted using the resist pattern 503 as a mask, so as to increase the impurity concentration of the semiconductor region 122 of the p-type. For instance, in this implantation of the impurities, boron fluoride is implanted under a condition of an acceleration energy of 10 keV and a dosage of approximately $5 \times 10^{12}$ to $6 \times 10^{12}$ cm$^{-2}$.

Subsequently, as illustrated in FIG. 3D, the resist pattern 503 is removed, and a semiconductor material is epitaxially grown on the semiconductor substrate 101 to form a semiconductor layer 106 (non-doped layer). For instance, the semiconductor layer 106 is a silicone layer. In the semiconductor layer 106, the channel region 116 of the memory transistor 10, the channel region 126 of the logic transistor 20, and the channel region 136 of the I/O transistor 30 are formed.

Figure 3E:
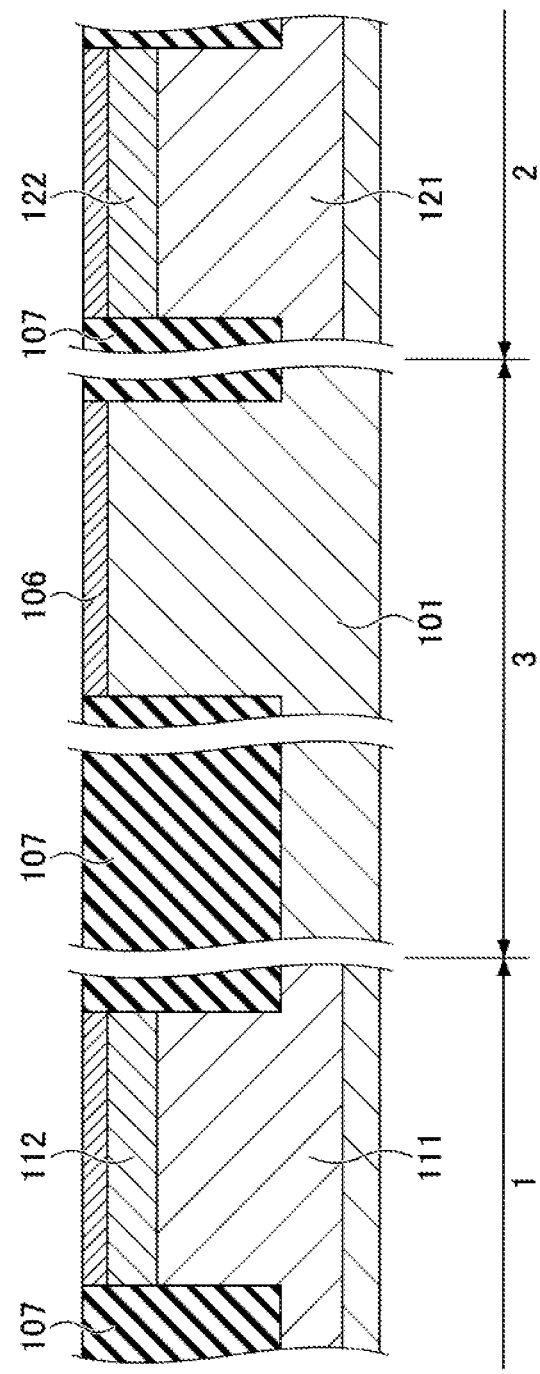

Next, as illustrated in FIG. 3E, element regions of the memory region 1, the logic region 2 and the I/O region 3 ace defined, and the element isolation regions 107 are formed to insulate these element regions from each other. For instance, the element isolation regions 107 may be formed by a Shallow Trench Isolation (STI) method.

Figure 3F:
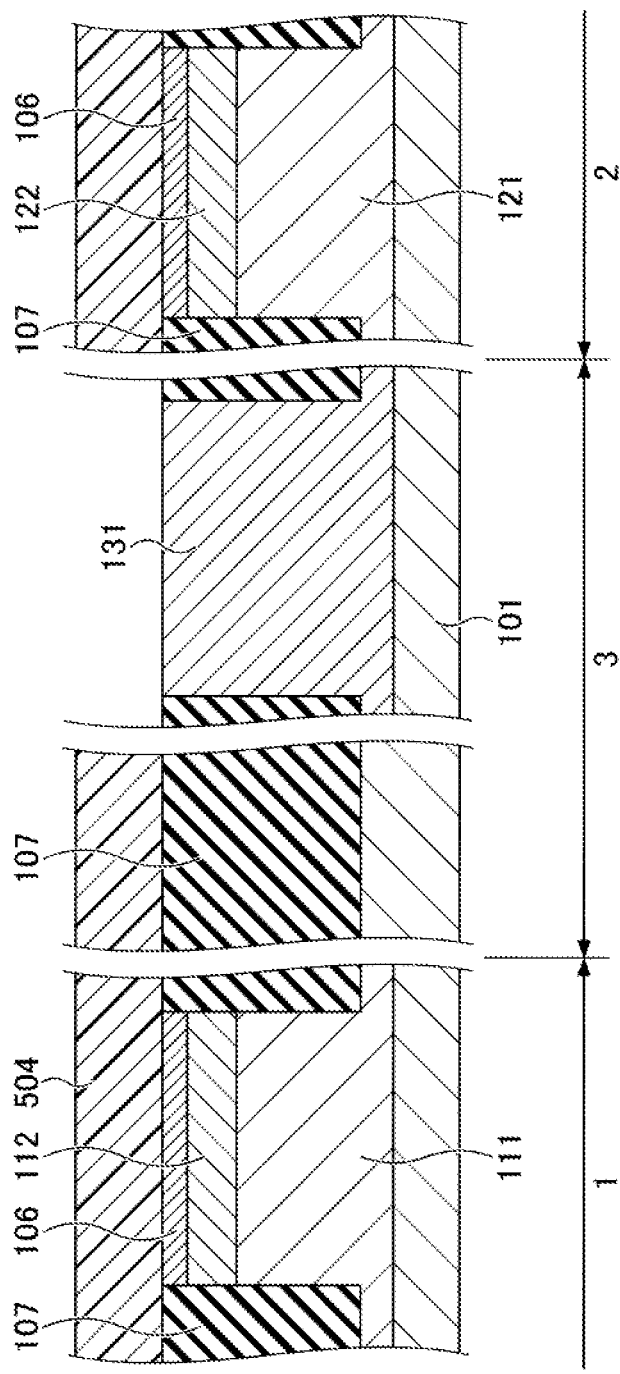

Next, as illustrated in FIG. 3F, a resist pattern 504 is formed on the semiconductor substrate 101. The resist pattern 504 exposes the element region of the I/O region 3 and covers the memory region 1 and the logic region 2. Subsequently, impurities are implanted using the resist pattern 504 as a mask to form a p-well 131 in the I/O region 3. Thereafter, an impurity implantation for adjusting the threshold voltage of the I/O transistor 30 may be performed on the p-well 131.

Figure 3G:
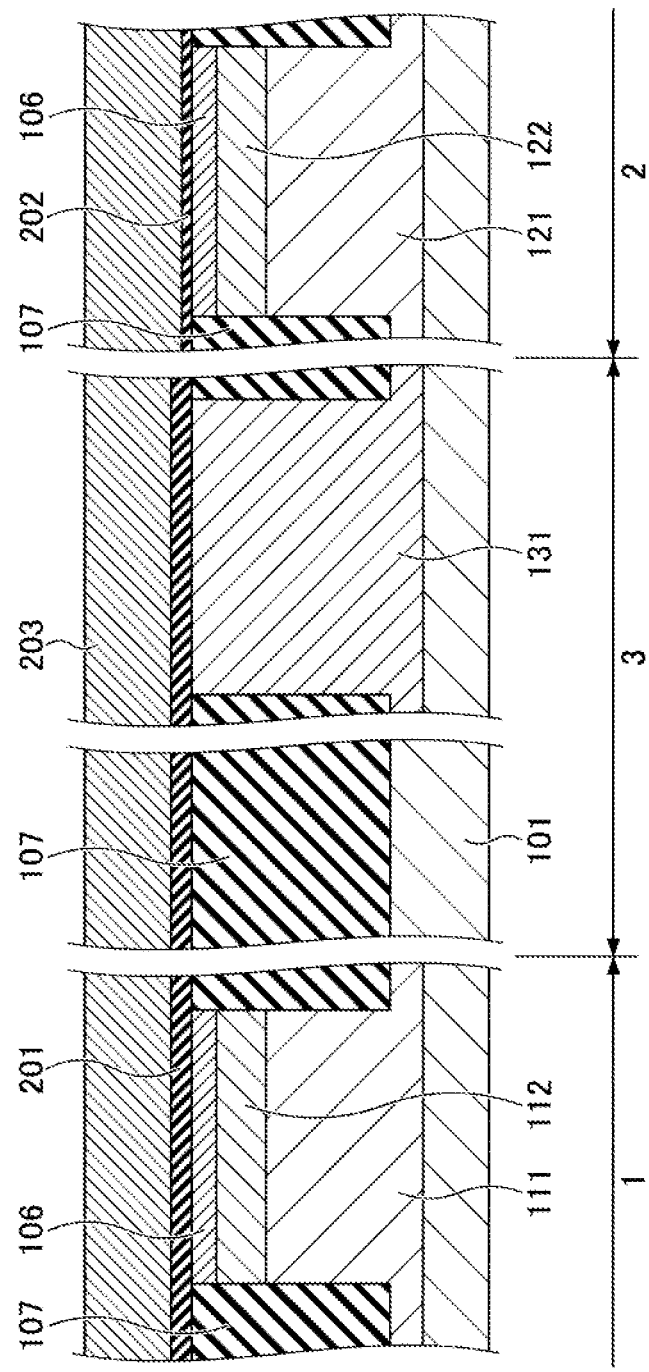

Nest, as illustrated in FIG. 3G, the resist pattern 504 is removed, an insulation film 201 is formed in the memory region 1 and the I/O region 3, and an insulation film 202 thinner than an insulation film 201 is formed in the logic region 2. For instance, in forming the insulation films 201 and 202, a first oxide film is formed on a surface of the semiconductor layer 106 by a thermal oxidation method, the oxide film in the logic region 2 is removed, and a second oxide film thinner than the first oxide film is formed in the logic region 2 by the thermal oxidation method. A third oxide film, in which the thickness of the first oxide film is increased during the formation of the second oxide film, becomes the insulation film 201, and the second oxide film becomes the insulation film 202.

For instance, the thickness of the insulation film 201 is approximately 6 nm to 8 nm, and the thickness of the insulation film 202 is approximately 1.5 nm to 2.5 nm. Thereafter, a polysilicon film 203 as a gate electrode material is formed on the insulation films 201 and 202. For instance, a thickness of the polysilicon film 203 may be 105 nm. The gate insulation film 212 of the memory transistor 10 and the gate insulation film 232 of the I/O transistor 30 are formed in the insulation film 201, and the gate insulation film 222 of the logic transistor 20 is formed in the insulation film 202.

According to the thermal oxidation method, the first oxide film, the second oxide film, and the third oxide film are formed on silicon; alternatively, for instance, another insulation film may be formed on the semiconductor substrate 101 by another method such as a CVD method. Therefore, the insulation film 201 and the insulation film 202 are illustrated so 33 to be formed also on the element isolation regions 107 in order to explain including forming insulation films by another method.

Next, as illustrated in FIG. 3H, a resist pattern 505 is formed on the polysilicon film 203. The resist pattern 505 covers the logic region 2 and the I/O region 3, and also covers a planned formation region of the gate electrode 211 in the memory region 1, while exposing remaining portions. Next, using the resist pattern 505 as a mask, the polysilicon film 203 is etched. As a result, the gate electrode 211 of the memory region 1 is formed. In the region from which the polysilicon film 203 is removed, the insulation film 201 remains.

Figure 3I:
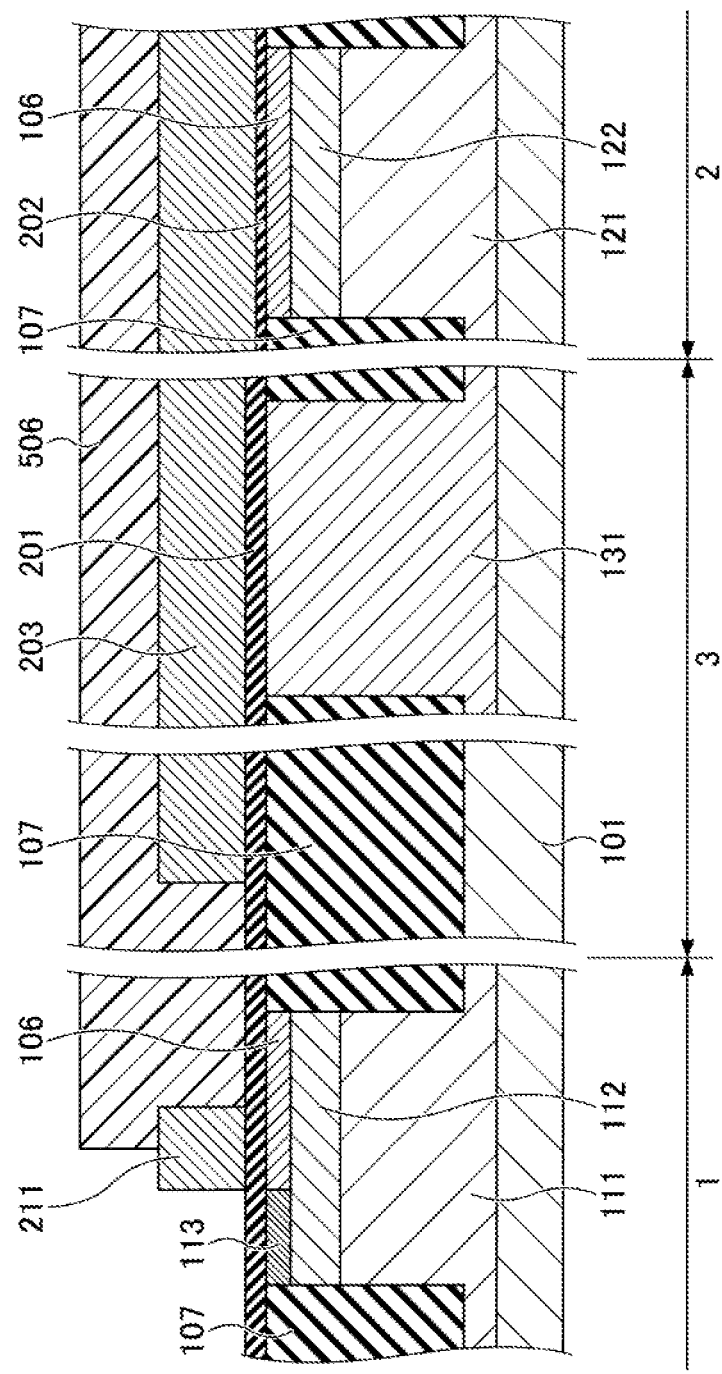

Next, as illustrated in FIG. 3I, the resist pattern 505 is removed, and a resist pattern 506 is formed on the polysilicon film 203 and the insulation film 201. The resist pattern 506 covers the logic region 2 and the I/O region 3, and also covers a planned formation region of the second semiconductor region 115d in the memory region 1, while exposing a planned formation region of the first semiconductor region 115s. Next, by implanting impurities using the gate electrode 211 and the resist pattern 506 as a mask, the LDD region 113 of the n-type is formed in the memory region 1. For instance, in this implantation of the impurities, arsenic is implanted under a condition of an acceleration energy of 10 keV and a dose of approximately $5.5 \times 10^{13}$ to $6.5 \times 10^{13}$ cm$^{-2}$.

Figure 3J:
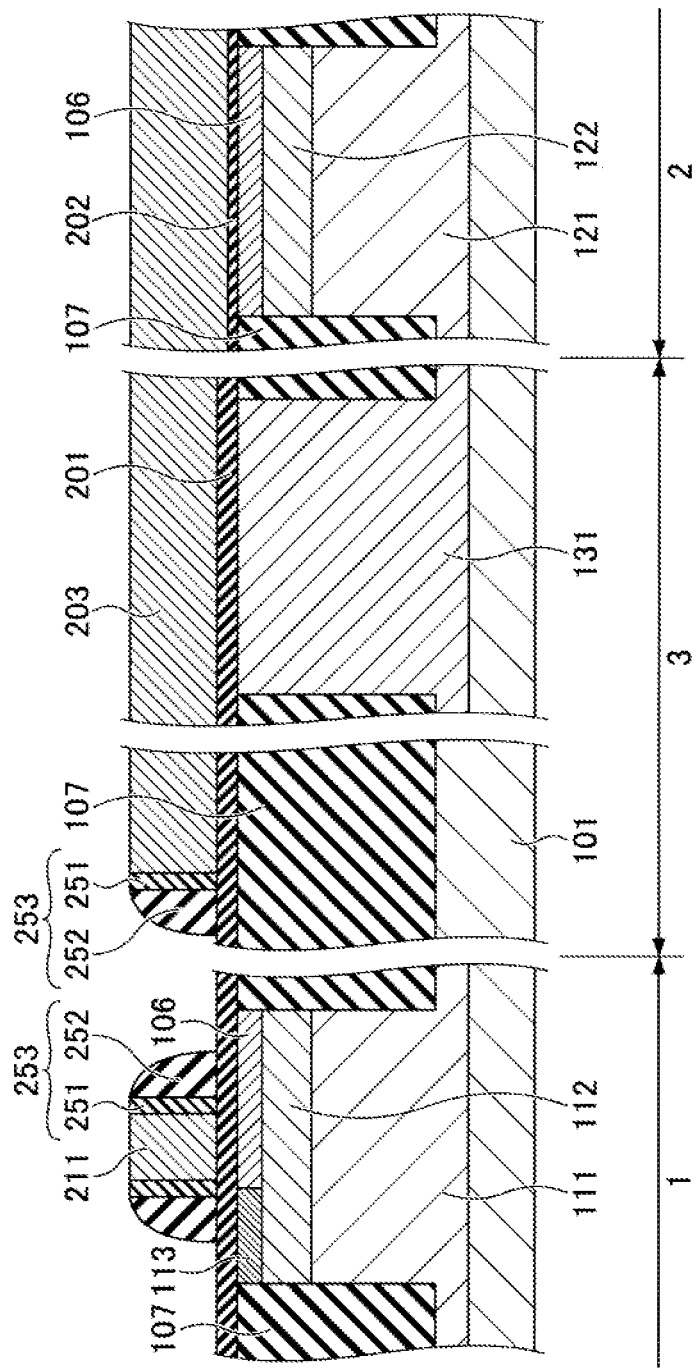

Subsequently, as illustrated in FIG. 3J, the resist pattern 506 is removed, the gate electrode 211 and the polysilicon film 203 are thermally oxidized to form an oxide film, and a nitride film is formed on this oxide film. For instance, the oxidation temperature of the oxide film is approximately 780 to 820° C., a thickness of the oxide film is approximately 1.8 to 2.2 nm, the film formation temperature of the nitride film is approximately 680 to 720° C., a thickness of the nitride film is approximately 60 to 80 nm. Subsequently, the nitride film is etched back.

As a result, as illustrated in FIG. 3J, a sidewall insulation film 253 including the oxide film 251 and the nitride film 252 is formed. The insulation film 201 remains to the outside of the sidewall insulation film 253. Similarly, a sidewall insulation film 253 is formed on a sidewall of the polysilicon film 203 and above the semiconductor substrate 101 (on the element isolation regions 107) other than the gate electrode 211. Moreover, when the nitride film 252 is etched back, the oxide film 251 thinner than the insulation film 201 may be removed by overetching or the like. For convenience of explanation, the oxide film 251 above the polysilicon film 203 and the gate electrode 211 are illustrated as disappeared in FIG. 3J.

Figure 3K:
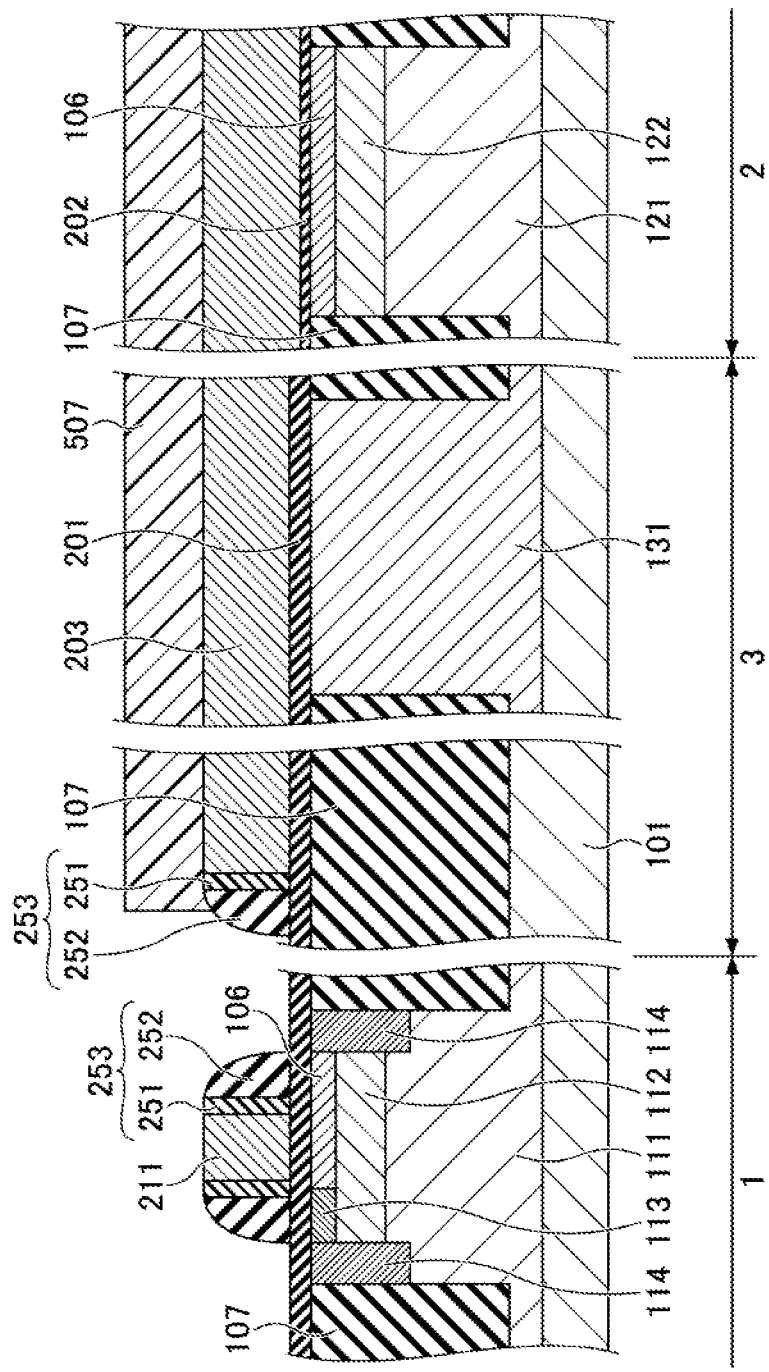

Next, as illustrated in FIG. 3K, a resist pattern 507 is formed on the polysilicon film 203 and the like. The resist pattern 507 exposes the memory region 1, and covers the logic region 2 and the I/O region 3. Thereafter, by using the resist pattern 507, the gate electrode 211, and the sidewall insulation film 253 in the memory region 1 as a mask, impurities are implanted to form the impurity region 114 of the n-type in the memory region 1.

The impurities are implanted under a condition such that the impurities are implanted to a region having a higher concentration than the LDD region 113 and being deeper than the LDD region 113. For instance, in the implantation of the impurities, phosphorus is implanted under a condition of an acceleration energy of 8 keV and dose of approximately $1 \times 10^{16}$ to $2 \times 10^{16}$ cm$^{-2}$. The impurity region 114 of the n-type functions as a source region 114s or the dram region 114d of the memory transistor 10.

Figure 3L:
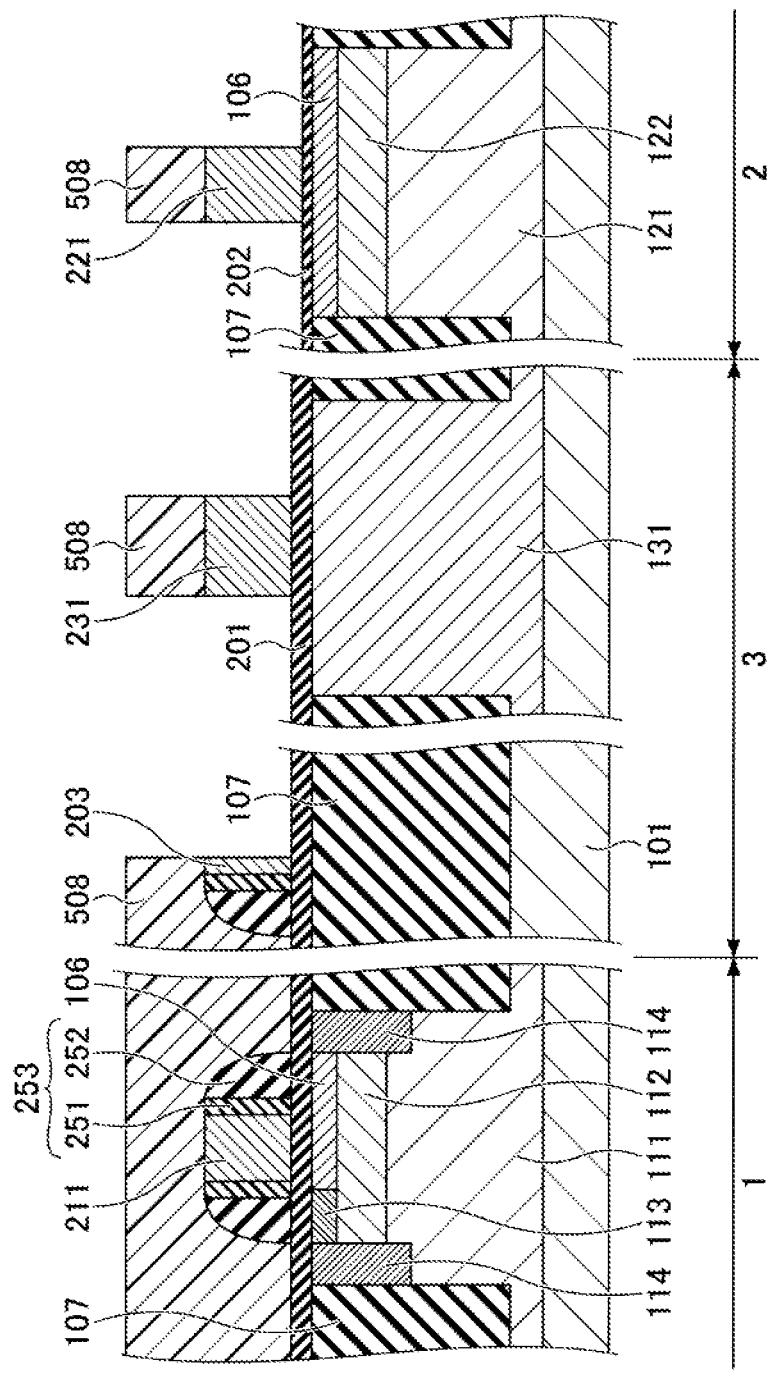

Subsequently, as illustrated in FIG. 3L, the resist pattern 507 is removed, and a resist pattern 508 is formed on the polysilicon film 203 and the like. The resist pattern 503 covers the memory region 1 and also covers the planned formation region of the gate electrode 221 in the logic region 2, while exposing remained portions. Also, the resist pattern 508 covers a planned formation region where the gate electrode 231 is to be formed in the I/O region 3, while exposing remained portions. Next, using the resist pattern 508 as a mask, the polysilicon film 203 is etched. As a result, the gate electrode 221 of the logic region 2 and the gate electrode 231 of the I/O region 3 are formed.

Figure 3M:
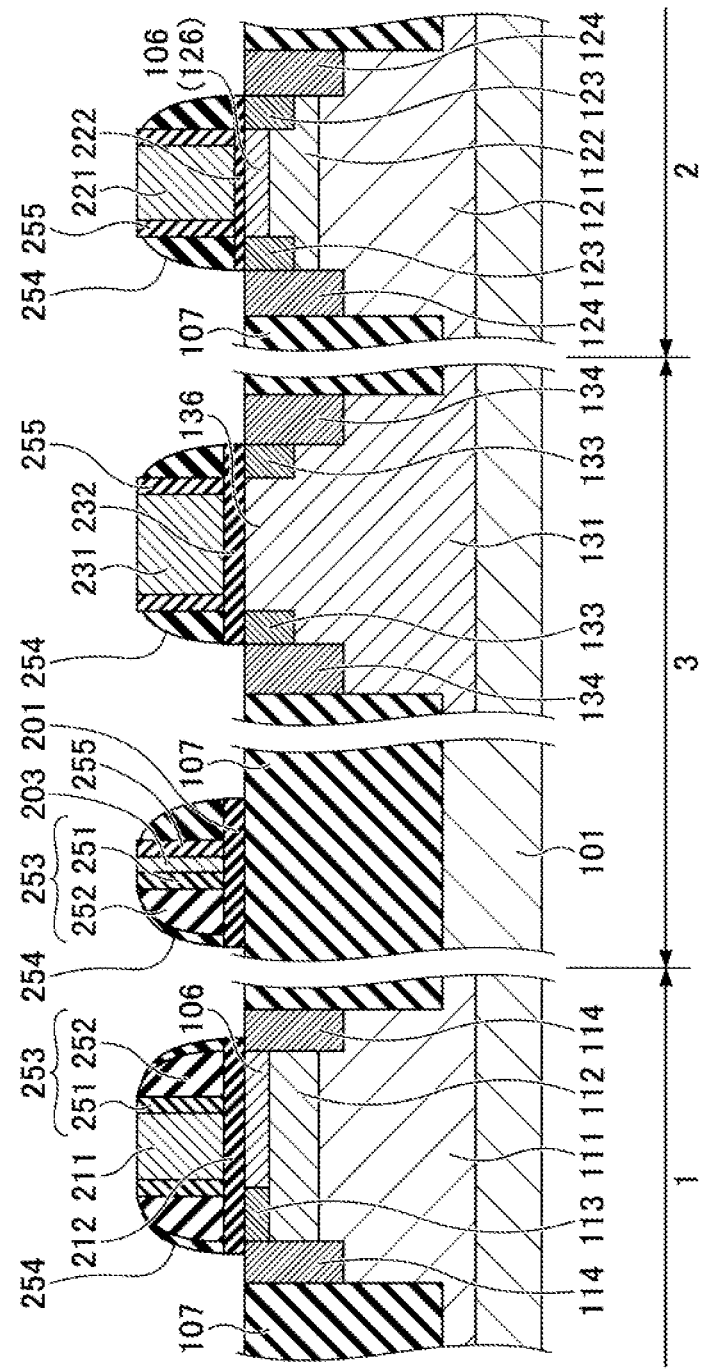

Following FIG. 3L, as illustrated in FIG. 3M, the resist pattern 508 is removed, an oxide film 255 is formed on sidewalls of the gate electrodes 221 and 231 by thermal oxidation, and impurities are implanted into the logic region 2 and the semiconductor substrate 101 of the I/O region 3, respectively. By this impurity implantation, the LDD region 123 is formed in the semiconductor substrate 101 on both sides of the gate electrode 221, and the LDD region 133 is formed in the semiconductor substrate 101 on both sides of the gate electrode 231.

For instance, the LDD region 123 is formed by implanting arsenic, which is an n-type impurity, under a condition of an acceleration energy of 1.5 keV and a dose of approximately $1\times10^{15}$ to $1.5\times10^{15}$ cm$^{-2}$. For instance, the LDD region 133 is formed by implanting phosphorus, which is an n-type impurity, under a condition of an acceleration energy of 35 keV and a dose of approximately $1\times10^{13}$ to $1.5\times10^{13}$ cm$^{-2}$.

Next, an insulation film, for instance, a silicon oxide film is formed with a thickness of approximately 70 to 90 nm, and is etched back. As a result, as illustrated in FIG. 3M, a sidewall insulation film 254 is formed at the sidewall of the gate electrode 221 and above the semiconductor substrate 101, and the sidewall insulation film 254 is formed at the sidewall of the gate electrode 231 and above the semiconductor substrate 101. Also, the insulation films 201 and 202 are etched, the gate insulation film 212 and the gate insulation film 232 are formed from the insulation film 201, and the gate insulation film 222 is formed from the insulation film 202. Similarly, the sidewall insulation film 254 is formed on an outer wall of the polysilicon film 203 remaining on the element isolation region 107, and the sidewall insulation film 254 is also formed over the sidewall insulation film 253 in the memory region 1.

After forming the sidewall insulation films 254, by implanting impurities into the semiconductor substrate 101 of the logic region 2 and the I/O region 3 with the gate electrodes 221 and 231 and the sidewall insulation films 254 formed on sidewalls thereof as a mask, the impurity regions 124 of the n-type are formed in the logic region 2, and the impurity regions 134 of the n-type are formed in the I/O region 3.

In the formation of the impurity regions 124 of the n-type, imparities are implanted under a condition such that the impurities are implanted to a region having a higher concentration than the LDD region 123 and being deeper than the LDD region 123. In the formation of the impurity region 134 of the n-type, impurities are implanted under a condition such that the impurities are implanted to a region having a higher concentration than the LDD region 133 and being deeper than the LDD region 133.

In the implantation of these impurities, for instance, phosphorus is implanted under a condition of an acceleration energy of 8 keV and a dose of approximately $1\times10^{16}$ to $1.5\times10^{16}$ cm$^{-2}$. The impurity regions 124 of the n-type function as a source region and a drain region of the logic transistor 20, respectively, and the n-type impurity regions 134 function as a source region and a drain region of the transistor 30, respectively.

These impurity implantations may be performed simultaneously for both the logic region 2 and the I/O region 3, or one of the logic region 2 and the I/O region 3 may be performed first.

By the above described steps, as illustrated in FIG. 3M, it is possible to acquire the semiconductor device 100 (non-volatile memory), in which the memory transistor 10, the logic transistor 20, and the I/O transistor 30 are mounted in common on the semiconductor substrate 101. Following these steps, a formation of an interlayer insulation films, a formation of plugs, a formation of a trace layer being an upper layer including conductive portions such as conductive traces and vias, and the like are performed.

Figure 4:
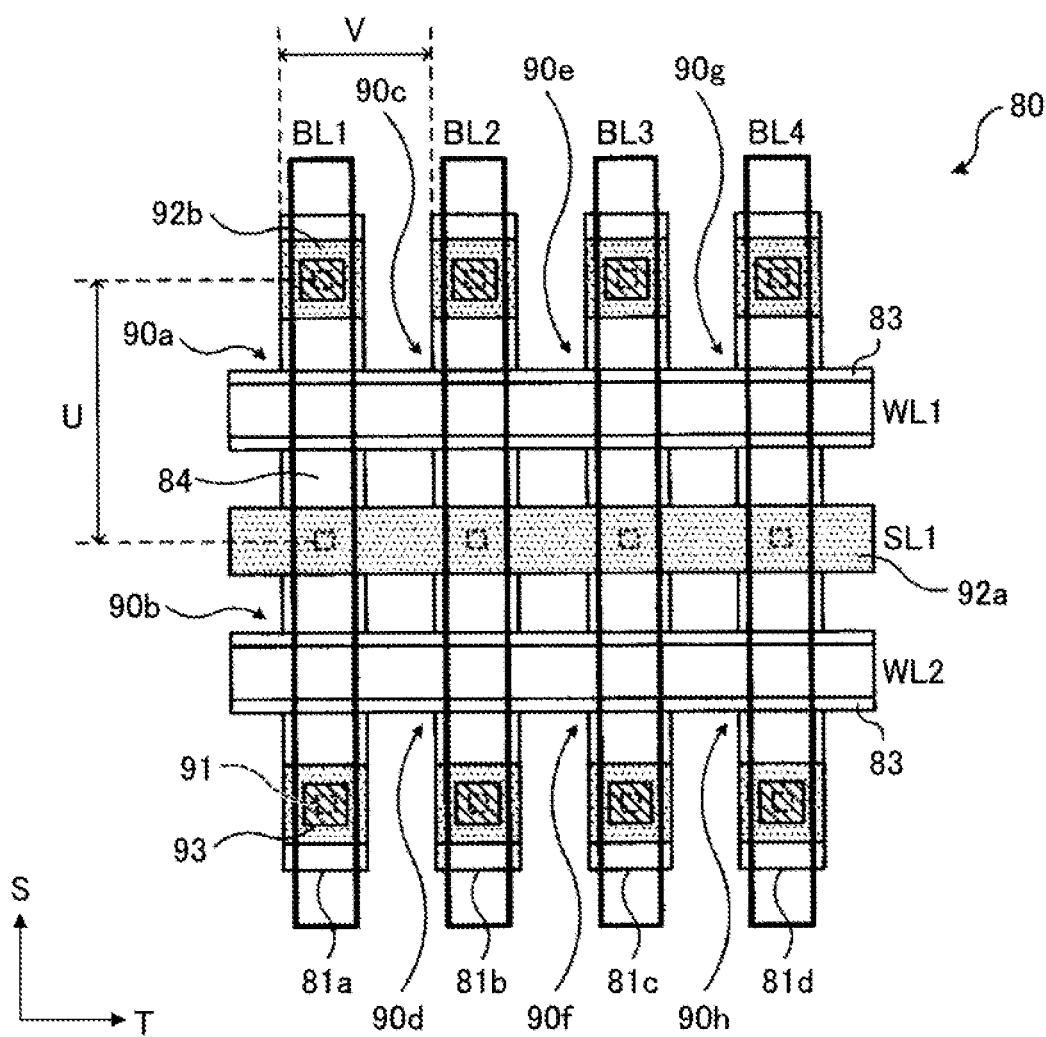
FIG. 4 is a diagram illustrating an example of a non-volatile memory including a plurality of memory transistors.

Next, a non-volatile memory including a plurality of memory transistors 10 will be described FIG. 4 is a diagram illustrating an example of a non-volatile memory including a plurality of memory transistors 10. FIG. 4 schematically depicts a planar layout of a main part of the example of a non-volatile memory including the plurality of memory transistors 10.

As illustrated in FIG. 4, the non-volatile memory 80 (semiconductor device) including a plurality of memory transistors 10 has a plurality of active regions 81a, 81b, 81c, and 81d (four active regions, for instance), which extend in a direction S as device regions defined in the element isolation regions (corresponding to element isolation regions 107) and are juxtaposed in a direction T orthogonal to the direction S. Word lines WL1 and WL2 (corresponding to the gate electrodes 211) extend in the direction T across a gate insulation film so as to traverse these active regions 81a, 81b, 81c, and 81d.

Sidewall insulation films 83 (corresponding to the sidewall insulation films 253) are formed on sidewalls of the word lines WL1 and WL2. Impurity regions 84 (corresponding to impurity regions 114) functioning as source regions or drain regions are formed on both sides of each of the word lines WL1 and WL2 in the active regions 81a, 81b, 81c, and 81d Under the sidewall insulation film 83, a first semiconductor region (corresponding to the first semiconductor region 115s) and a second semiconductor region (corresponding to the second semiconductor region 115d) are formed inside the two impurity regions 84, and a channel region (corresponding to the channel region 116) is formed between the first and second semiconductor regions. Also, below the channel region, an impurity region (corresponding to the third semiconductor region 112) to be an SCR layer is formed.

The non-volatile memory 80 includes a plurality of memory transistors 90a, 90b, 90c, 90d, 90e, 90f, 90g, and 90h (each corresponding to the memory transistor 10) formed by these elements. As an example, eight memory transistors 90a to 90h are depicted.

On each of the impurity regions 84, plugs 91 (contacts) are formed extending toward an upper layer. Each of the impurity regions 84 is connected to conductive traces 92a and 92b included in a conductor layer of a first layer via the plugs 91.

The conductive trace 92a extends in the direction T. The conductive trace 92a is connected to the impurity region 84 shared by the memory transistors 90a and 90b of the active region 81a via the plugs 91. The conductive trace 92a is connected to the impurity region 84 shared by the memory transistors 90c and 90d of the active region 81b via the plugs 91. The conductive trace 92a is connected to the impurity region 84 shared by the memory transistors 90e and 90f of the active region 81c via the plugs 91. The conductive trace 92a is connected to the impurity region 84 shared by the memory transistors 90g and 90h of the active region 81d via the plugs 91. The conductive trace 92a is used as a source line SL1.

The conductive trace 92b is connected to the impurity region 84 on a side opposite to the impurity region 84 connected to the source line SL1 of each of the memory transistors 90a, 90b, 90c, 90d, 90e, 90f, 90g, and 90h via the plugs 91.

Vias 93 extending toward the upper layer are formed on each of the conductive traces 92b. The conductive trace 92b connected to the impurity region 84 of the memory transistors 90a and 90b of the active region 81a is connected to a bit line BL1 extending in the direction S through the via 93. The conductive trace 92b connected to the impurity region 84 of the memory transistors 90c and 90d in the active region 81b is connected to a bit line BL2 extending in the direction S through the via 93.

The conductive trace 92b connected to the impurity region 84 of the memory transistors 90e and 90f of the active region 81c is connected to a bit line BL3 extending in the direction S through the via 93. The conductive trace 92b connected to the impurity region 84 of the memory transistors 90g and 90h of the active region 81d is connected to a bit line BL4 extending in the direction S through the via 93. The bit lines BL1, BL2, BL3, and BL4 are included in the conductive layer of the second layer of the non-volatile memory 80.

In the non-volatile memory 80, each of memory transistors 90a, 90b, 90c, 90d, 90e, 90f, 90g, and 90h functions as one memory cell. Each example of the program operation, the read operation, and the erase operation of information in the non-volatile memory 80 will be described in detail with reference to FIG. 5A, FIG. 5B, FIG. 6A, FIG. 6B, FIG. 7A and FIG. 7B.

Figure 5A:
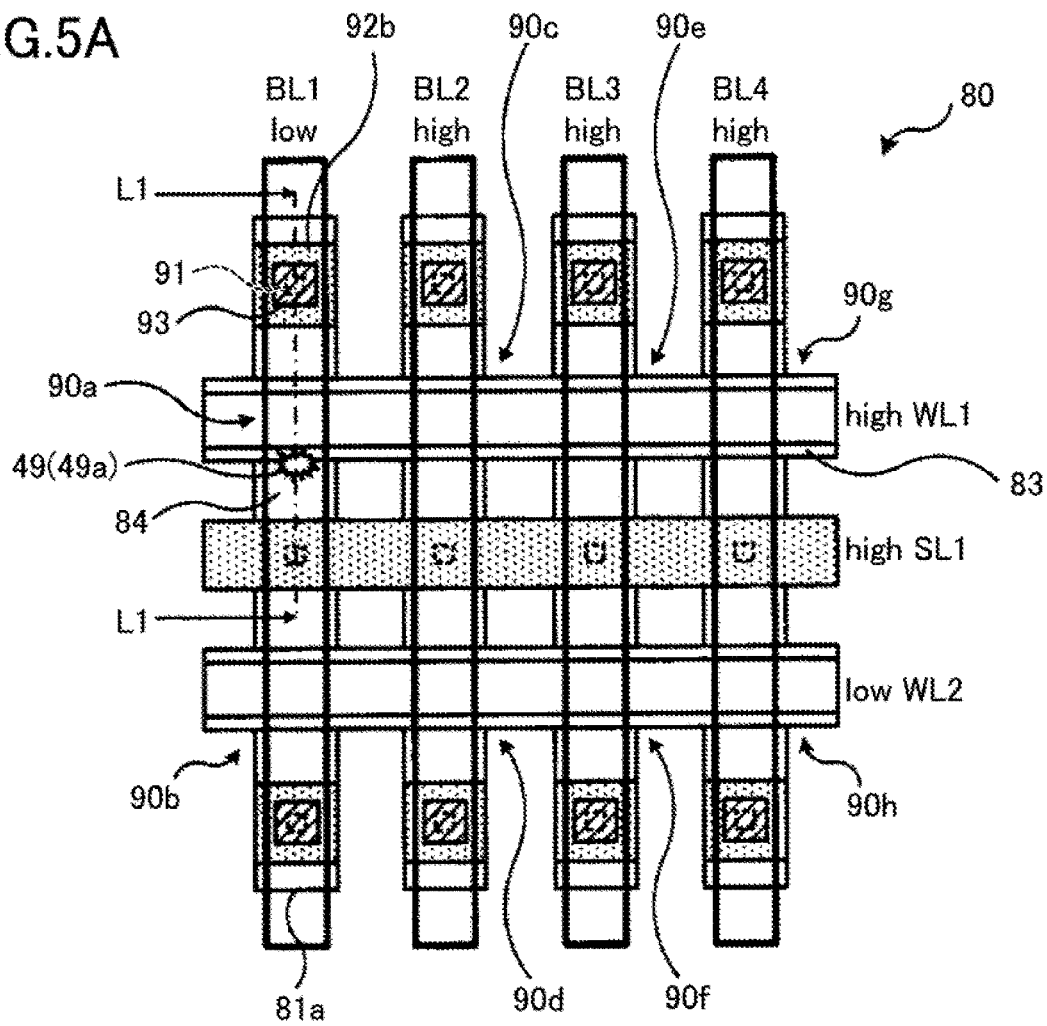
FIG. 5A and FIG. 5B are diagrams illustrating a program operation of a non-volatile memory.
Figure 5B:
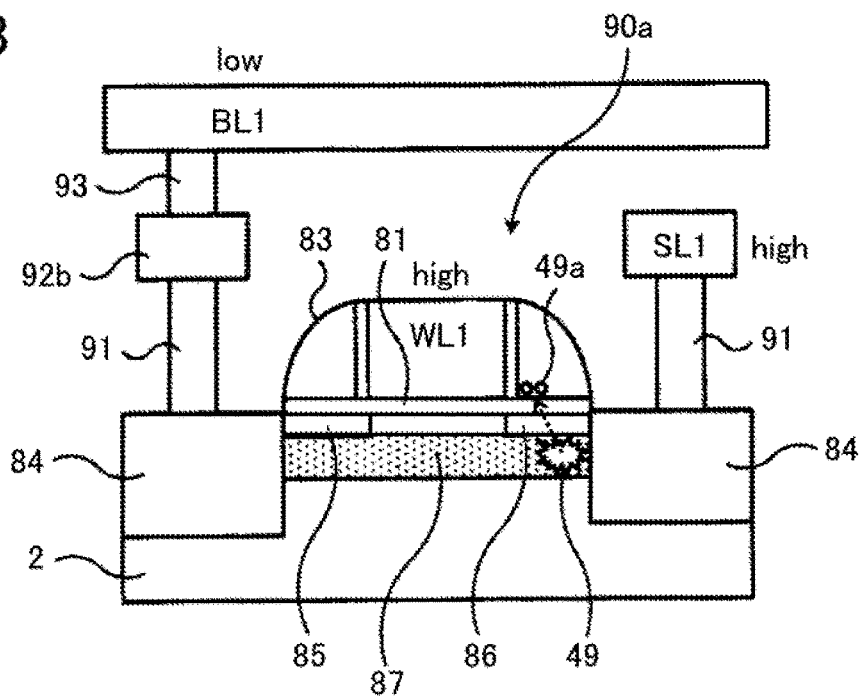

FIG. 5A and FIG. 5B are diagrams illustrating the program operation of the non-volatile memory 80. FIG. 5A schematically illustrates a plane view of a main part of the non-volatile memory during the program operation, and FIG. 5B schematically illustrates a cross-section of the main part of the non-volatile memory daring program operation. FIG. 5B is a schematic sectional view taken along a line L1-L1 in FIG. 5A.

For instance, during the program operation for the memory transistor 90a (memory ceil), a potential of the word line WL1 on the gate insulation film 81 is high (4V to 5V), a potential of the bit line BL1 is low (0V), and a potential of the source line SL1 is high (4V to 5V). A potential of an unselected word line WL2 is low (0V), and potentials of unselected bit lines BL2 to BL4 are high (4V to 5V).

As a result, hot electrons (the hot carriers 49 and the electric charges 49a) are injected and accumulated in the sidewall insulation film 83 (corresponding to a second portion 253d) above the second semiconductor region 86 (corresponding to the second semiconductor region 115d) of the memory transistor 90a, and information is programmed.

Because the second semiconductor region 86 of the memory transistor 90a has a very low concentration, an electric field of the second semiconductor region 86 is relatively small. However, because the impurity region 84 adjacent to an outside of the second semiconductor region 86 has a high concentration, the electric field abruptly increases at an end portion of the impurity region 84. As a result, the hot electrons are efficiently generated in a vicinity of the impurity region 84 (drain) on a side of the source line SL1, and the generated hot electrons are efficiently injected into the sidewall insulation film 83 above the second semiconductor region 86. Moreover, because the impurity concentration of the first semiconductor region 85 is higher than the impurity concentration of the second semiconductor region 36, it is possible to obtain excellent endurance.

Figure 6A:
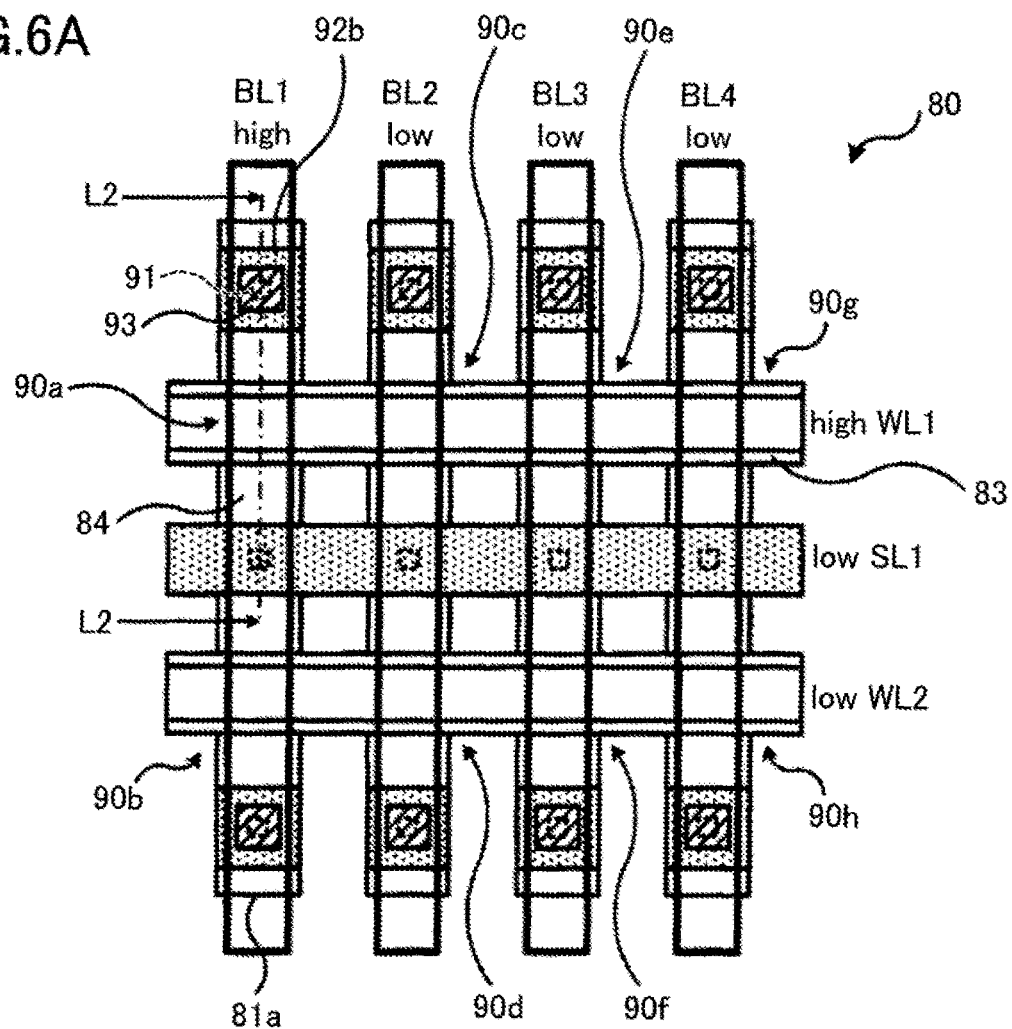
FIG. 6A and FIG. 6B are diagrams illustrating a read operation of the non-volatile memory.
Figure 6B:
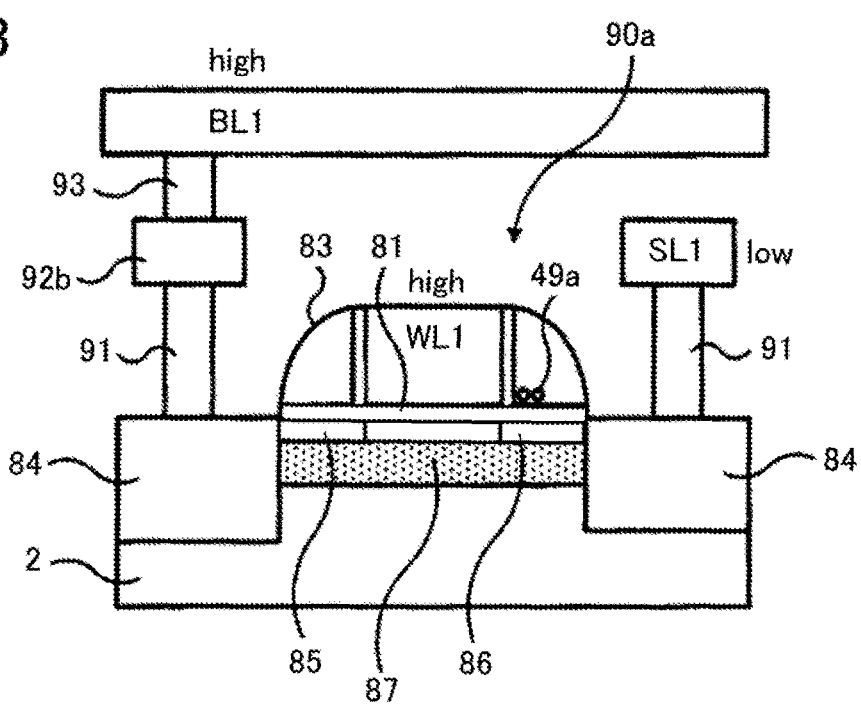

FIG. 6A and FIG. 6B are diagrams illustrating the read operation of the non-volatile memory 80. FIG. 6A schematically illustrates a plane view of a main part of the non-volatile memory during the read operation, and FIG. 6B schematically illustrates a cross section of the main part of the non-volatile memory in the read operation. FIG. 6B is a schematic cross-sectional view taken along a line L2-L2 in FIG. 6A.

During the read operation for the memory transistor 90a, the potential of the word line WL1 is high (2.0V), the potential of the bit line BL1 is high (0.5V), and the potential of the source line SL1 is low (0V). The potential of an unselected word line WL2 is low (0V), and the potentials of unselected bit lines BL2 to BL4 are low (0V).

FIG. 6A and FIG. 6B illustrate the memory transistor 90a in which electric charges 49a are injected and accumulated in the sidewall insulation film 83. By detecting a current flowing from the bit line BL1 to the source line SL1 when such a potential is set, the information of the memory transistor 90a is read.

Figure 7A:
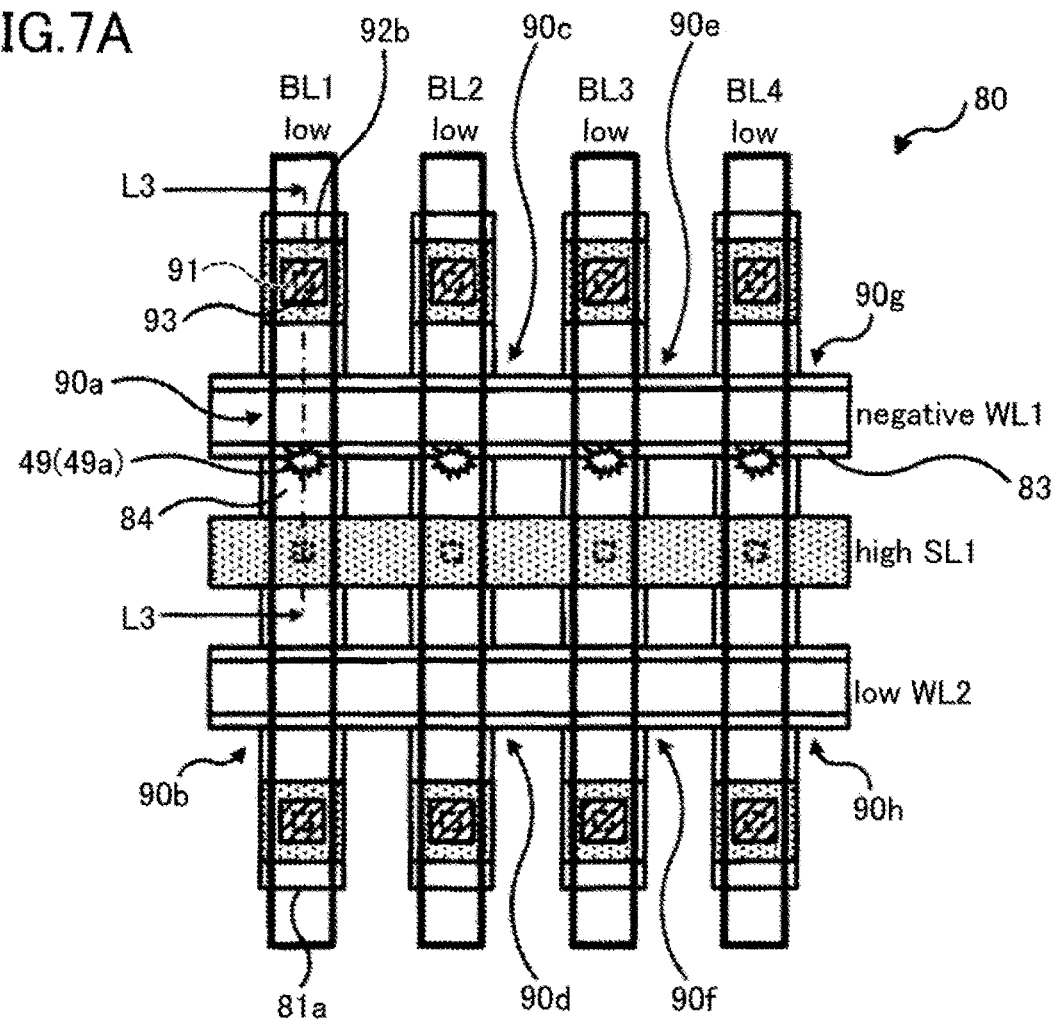
FIG. 7A and FIG. 7B are diagrams illustrating an erase operation of the non-volatile memory.
Figure 7B:
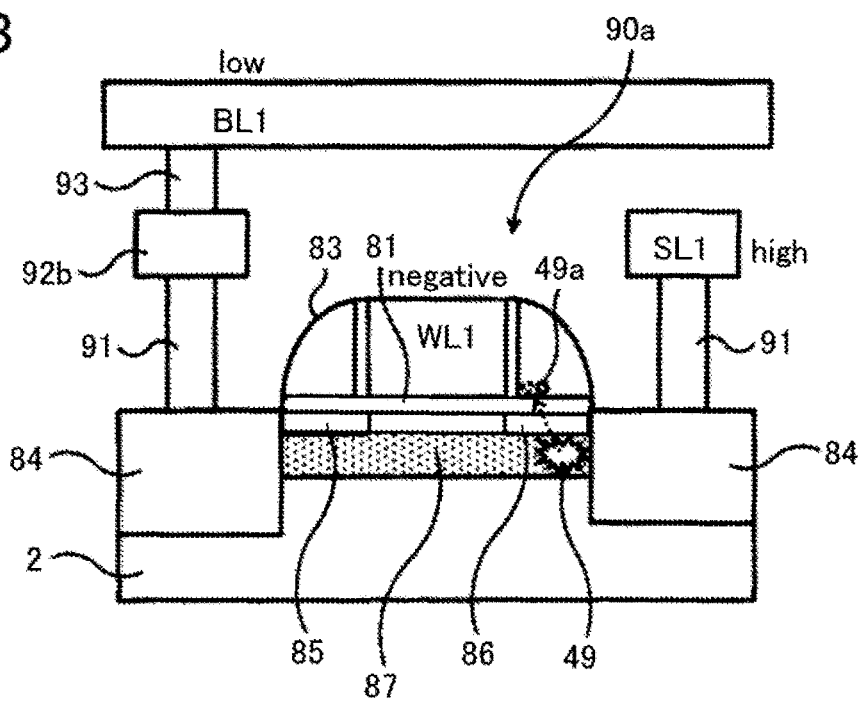
Figure 8:
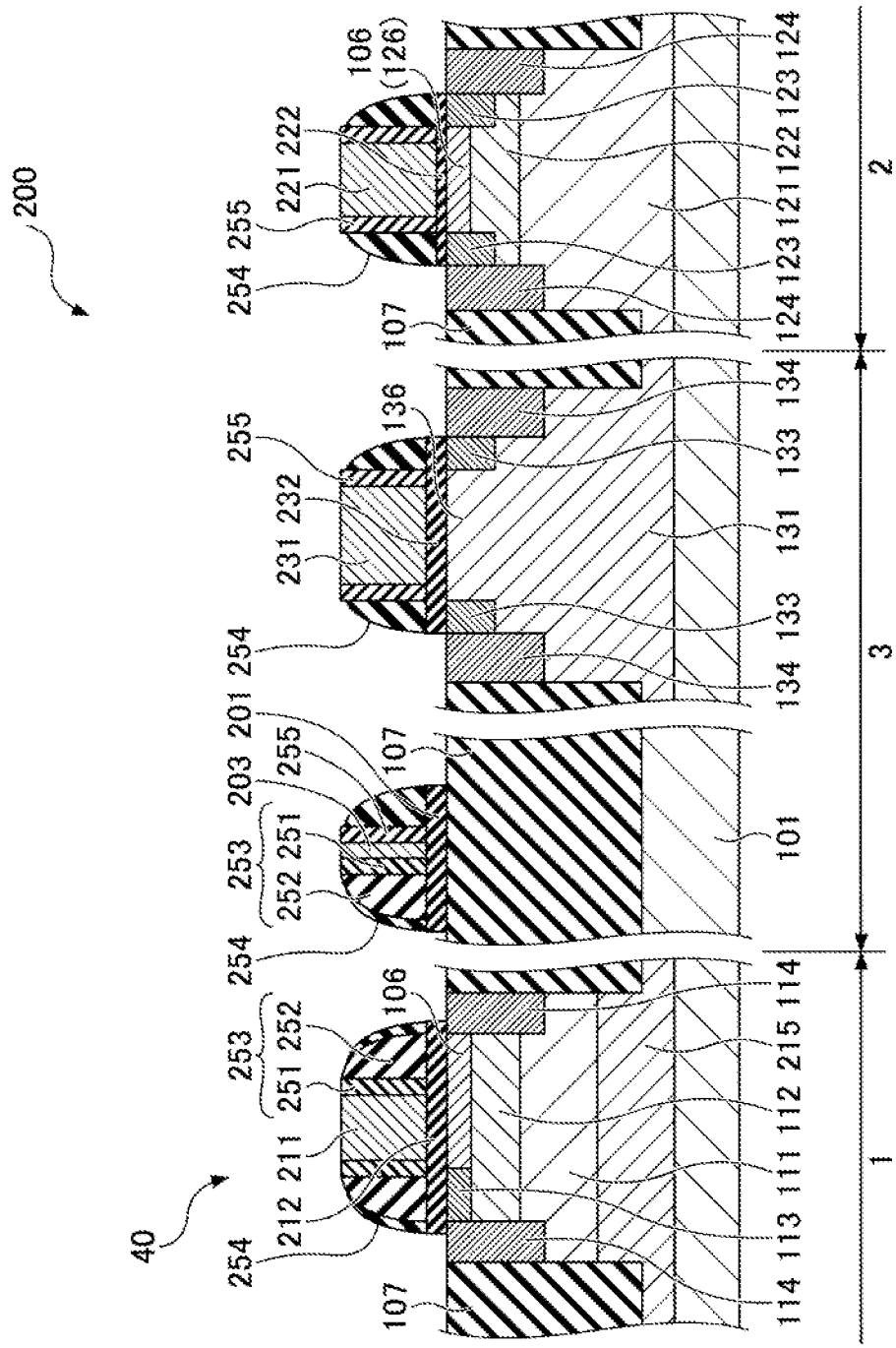
FIG. 8 is a cross-sectional view illustrating a semiconductor device according to a second embodiment.

FIG. 7A and FIG. 7B are diagrams illustrating the erase operation of the non-volatile memory 80. FIG. 7A schematically illustrates a plane view of a main part of the non-volatile memory during the erase operation, and FIG. 7B schematically illustrates a cross section of the main part of the non-volatile memory in the erase operation. FIG. 7B is a schematic cross-sectional view taken along a line L3-L3 in FIG. 7A.

In the erase operation for the memory transistor 90a, the program operation as described above is first performed on the memory transistors 90a, 90c, 90e, and 90g connected to the word line WL1. After the memory transistors 50a, 90c, 90e, and 90g are set in a programmed state as described above, a potential of the word line WL1 is negative (−5V to −6V), potentials of the bit lines BL1 to BL4 are low (0V), and potential of the source line SL1 is high (5V to 6V). A potential of the unselected word line WL2 is low (0V).

As a result, the programmed information in the memory transistors 90a, 90c, 90e, and 90g connected to the word line WL1 including the memory transistor 90a is erased.

During the erase operation, hot holes (hot carriers 49) are generated in a vicinity of the impurity region 84 on the side of the source line SL1, and electrons (electric charges 49a) accumulated in the sidewall insulation film 83 above the second semiconductor region 86 are neutralized. Because the hot holes are generated in the vicinity of the impurity region 84 on the side of the source line SL1, an effect on the threshold voltage of the region distanced from the impurity region 84 is controlled. Therefore, unless a gate length Lg of the word line WL1 is excessively reduced, the threshold voltage is positive as a whole, that is, an off-state current of the memory transistor 90a does not largely exceed an initial value.

Second Embodiment

Next, a second embodiment will be described. FIG. 3 is a cross-sectional view illustrating a semiconductor device according to the second embodiment.

A semiconductor device 200 according to the second embodiment is an example of a non-volatile memory, and includes a memory transistor 40 in the memory region 1, instead of the memory transistor 10. The memory transistor 40 has the same conductivity type as that of the third semiconductor region 112 and the p-well 111 (fourth semiconductor region), that is, a high concentration buried layer 215 of the p type below the third semiconductor region 112 in the first embodiment. Other configurations are the same as those in the first embodiment.

According to the second embodiment, because the high concentration buried layer 215 is provided, it is possible to reduce the resistance (well resistance) when a bias (substrate bias) is applied to the semiconductor substrate 101. For instance, by reducing the well resistance, it is possible to reduce the substrate bias to be applied.

The high concentration buried layer 215 is formed as follows. For instance, after the step (FIG. 3B) for increasing the impurity concentration of the third semiconductor region 112, boron is implanted using the resist pattern 502 as a mask under a condition of an acceleration energy of 200 keV and a dose of $1 \times 10^{14}$ to $2 \times 10^{14}$ cm$^{-2}$. Thereafter, by performing the same process as those in the first embodiment, the semiconductor device 200 according to the second embodiment is manufactured.

Third Embodiment

Figure 9:
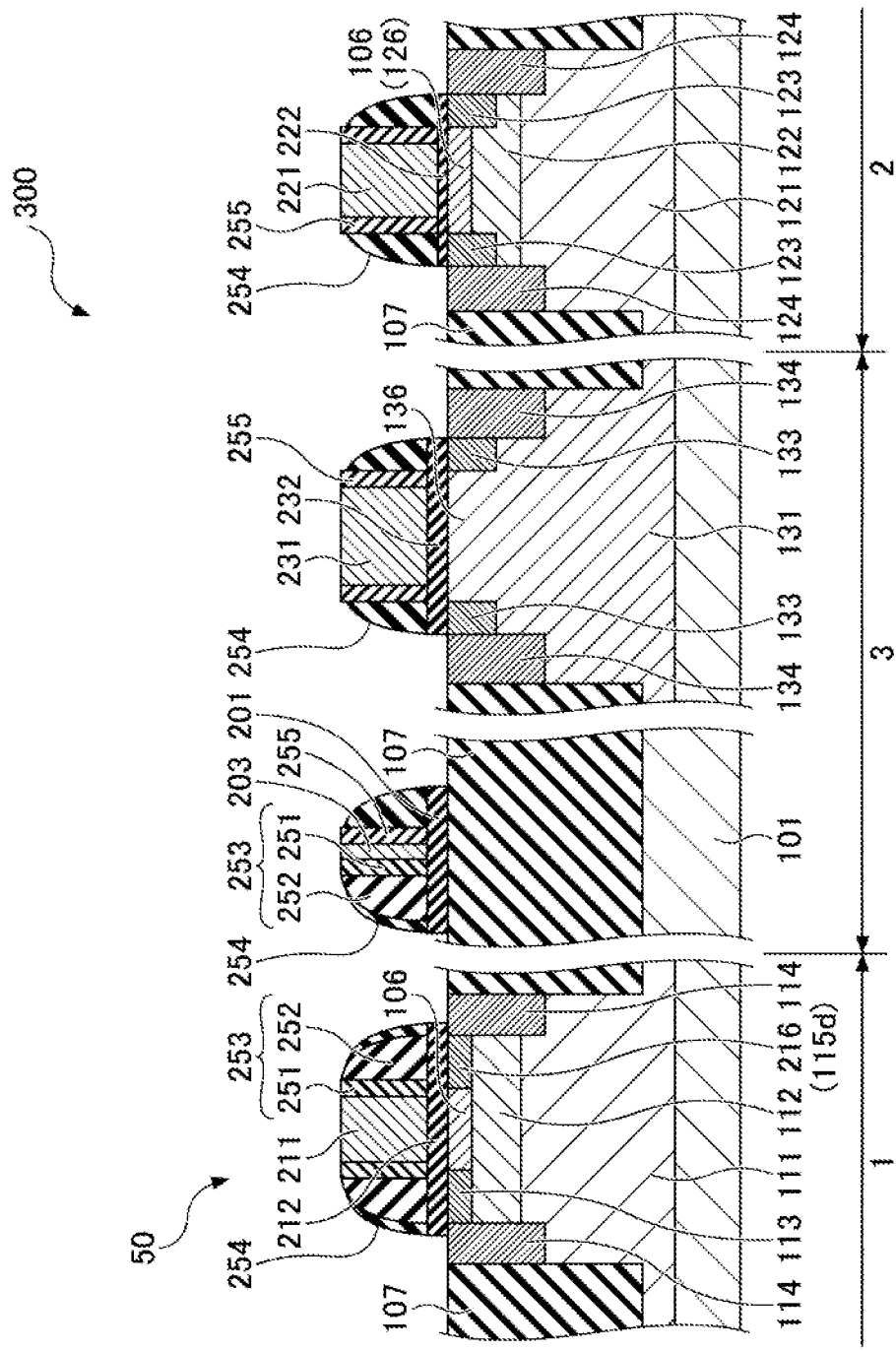
FIG. 9 is a cross-sectional view illustrating a semiconductor device according to a third embodiment.

Next, a third embodiment will be described. FIG. 9 is a cross-sectional view illustrating a semiconductor device according to the third embodiment.

A semiconductor device 300 according to the third embodiment is an example of a non-volatile memory and includes a memory transistor 50 in the memory region 1, instead of the memory transistor 10. In the memory transistor 50, the second semiconductor region 115d in the first embodiment is not a non-doped region but is of the same conductivity type as the LDD region 113, that is, an LDD region 216 of the n-type. A concentration of the n-type impurity in the LDD region 216 is lower than a concentration of the n-type impurity in the LDD region 113. Other configurations are the same as those in the first embodiment.

Also, in the third embodiment, it is possible to obtain the same effect as in the first embodiment.

Figure 10A:
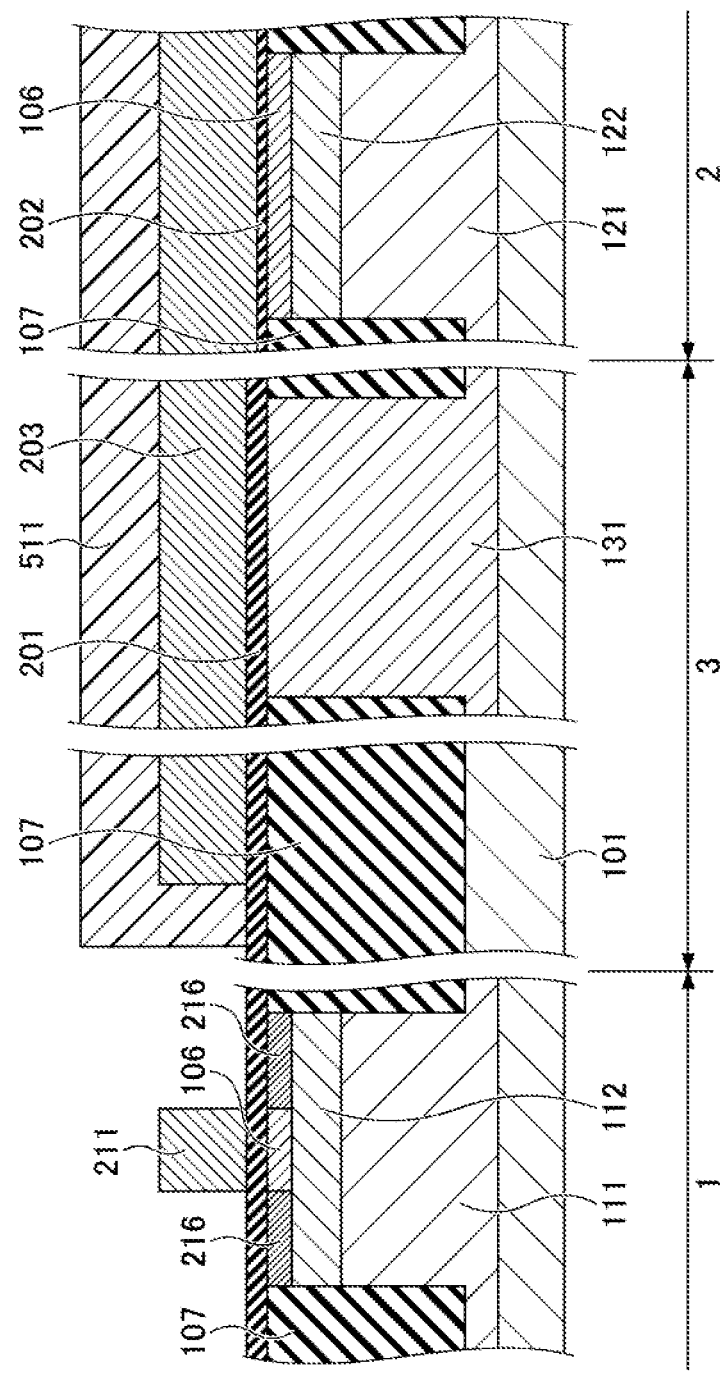
FIG. 10A and FIG. 10B are cross-sectional views illustrating a method of fabricating the semiconductor device according to the third embodiment in an order of steps.
Figure 10B:
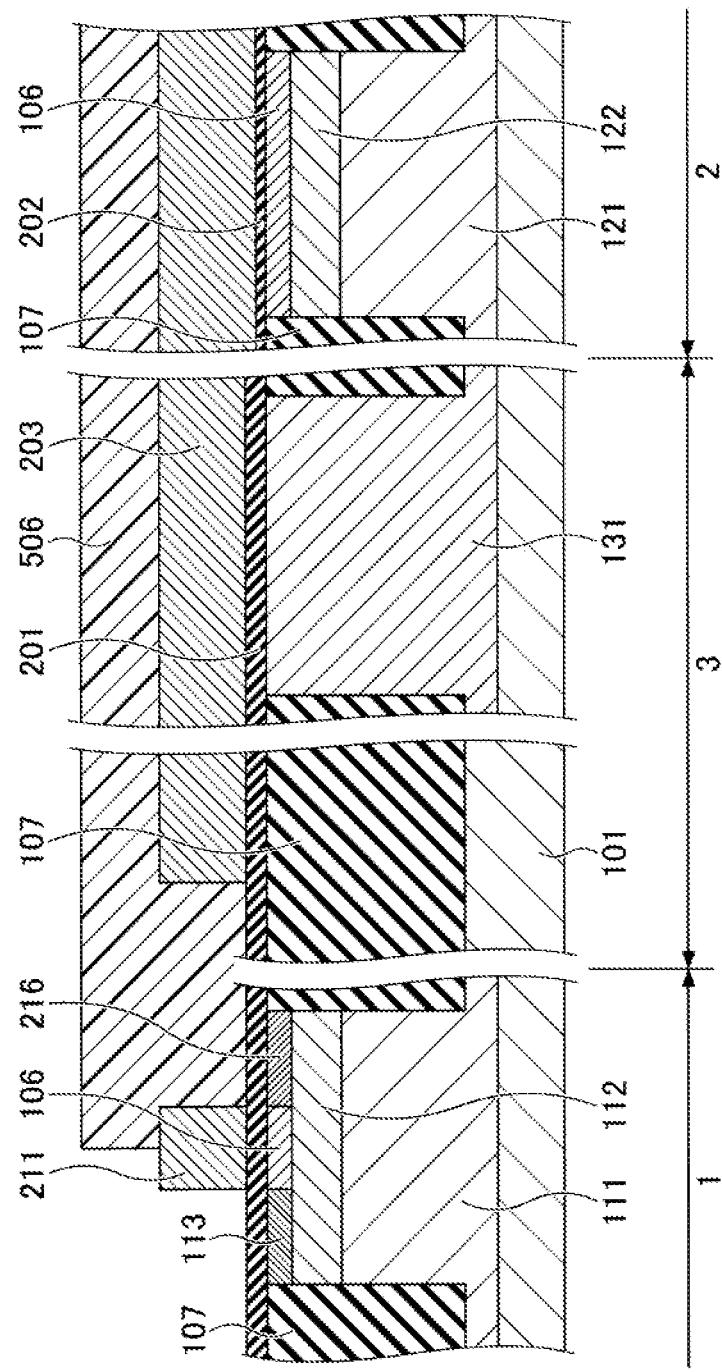

Next, a method for fabricating the semiconductor device 300 according to the third embodiment will be described. FIG. 10A and FIG. 10B are cross-sectional views illustrating a method of fabricating the semiconductor device 300 according to the third embodiment in an order of steps.

First, as illustrated in FIG. 10A, similarly to the first embodiment, a process up to a formation of the gate electrode 211 is performed (FIG. 3H). Next, the resist pattern 505 is removed, and a resist pattern 511 is formed on the polysilicon film 203 and the insulation film 201. The resist pattern 511 covers the logic region 2 and the I/O region 3, and exposes the memory region 1. Thereafter, by implanting impurities using the gate electrode 211 and the resist pattern 511 as a mask, the LDD region 216 of the n-type is formed in the memory region 1.

For instance, in this implantation of the impurities, phosphorus is implanted under the condition of an acceleration energy of 20 keV and a dose of approximately $5.5 \times 10^{11}$ to $6.5 \times 10^{11}$ cm$^{-2}$. Because the impurities implanted in this step have a very low concentration, even if the impurities are implanted into the polysilicon film 203, an effect on the logic transistor 20 and the I/O transistor 30 is negligible. Accordingly, the impurities may be implanted without forming the resist pattern 511. By omitting the formation of the resist pattern 511, it is possible to reduce the number of processes and to reduce the fabrication cost.

Subsequently, as illustrated in FIG. 10B, the resist pattern 511 is removed, and the resist pattern 506 is formed on the polysilicon film 203 and the insulation film 201. In a case in which the LDD region 216 is formed without forming the resist pattern 511, the resist pattern 506 is formed as it is after the LDD region 216 is formed. Next, by implanting impurities using the gate electrode 211 and the resist pattern 506 as masks, the LDD region 113 of the n-type is formed in the memory region 1, similar to the first embodiment. For instance, in this implantation of the impurities, arsenic is implanted under the condition of an acceleration energy of 10 keV and a dose of approximately $5.5 \times 10^{13}$ to $6.5 \times 10^{13}$ cm$^{-2}$. Thereafter, by performing the same processes as those in the first embodiment, it is possible to fabricate the semiconductor device 300 according to the third embodiment.

Fourth Embodiment

Figure 11:
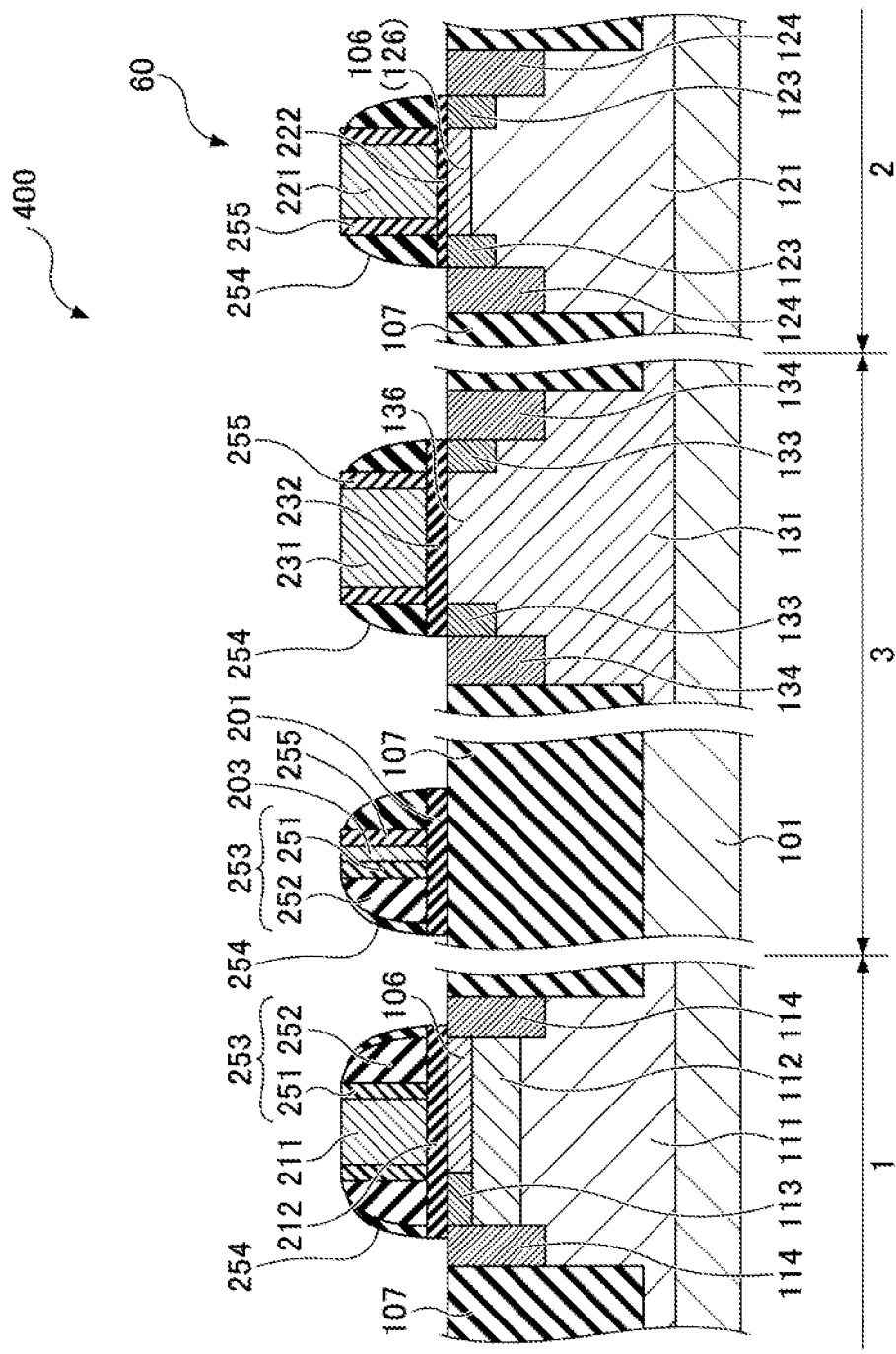
FIG. 11 is a cross-sectional view illustrating a semiconductor device according to a fourth embodiment.

Next, a fourth embodiment will be described. FIG. 11 is a cross-sectional view illustrating a semiconductor device according to the fourth embodiment.

A semiconductor device 400 according to the fourth embodiment is an example of a non-volatile memory, and includes a logic transistor 60 in the logic region 2, instead of the logic transistor 20. The logic transistor 60 does not include the semiconductor region 122 in the first embodiment, and the LDD region 123 and the channel region 126 are in contact with the p-well 121. Other configurations are the same as those in the first embodiment.

According to the fourth embodiment, it is possible to obtain the same effect as in the first embodiment.

Figure 12A:
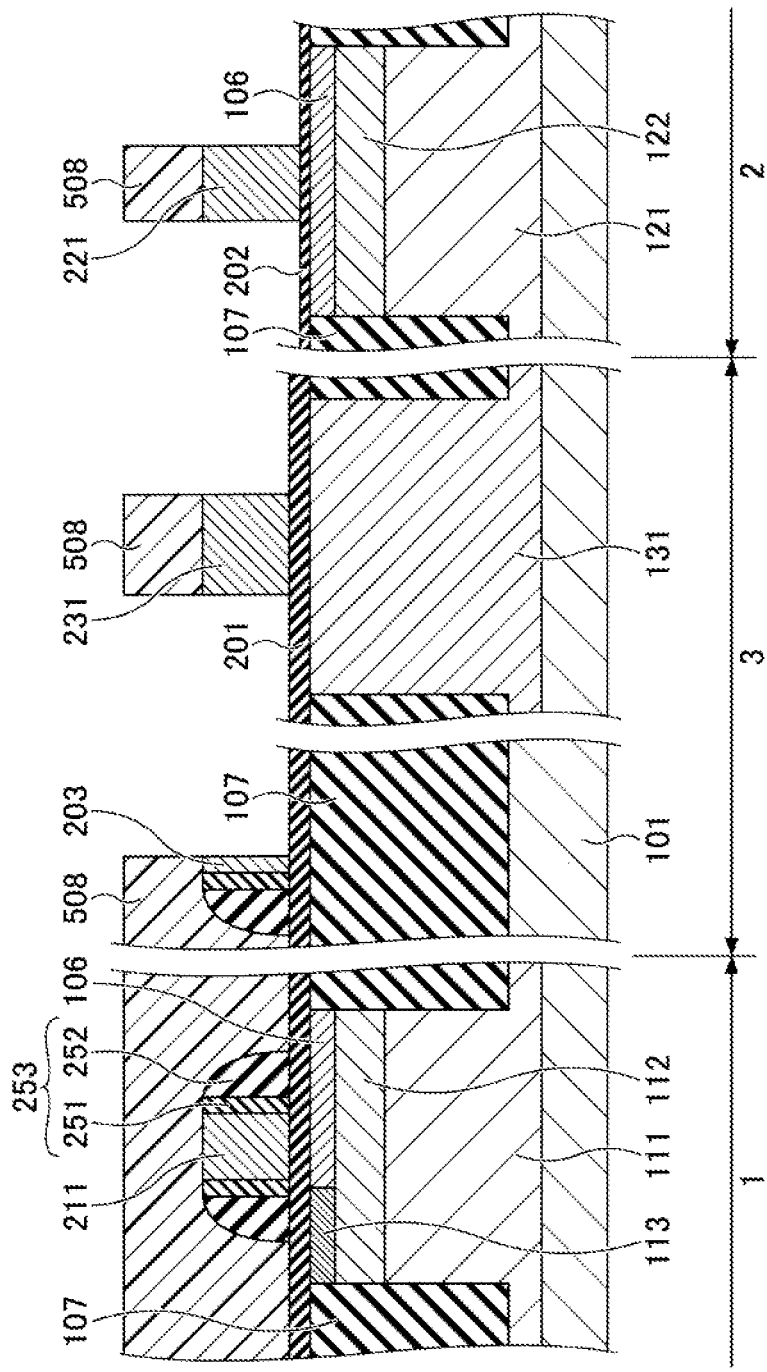

The impurity region 114 may be formed simultaneously with either one or both the impurity region 124 and the impurity region 134. In this case, as illustrated in FIG. 12A, the impurity region 114 is not formed at the time when the gate electrodes 221 and 231 are formed, and thereafter, the impurity region 114 is formed simultaneously with the impurity region 124 and/or the impurity region 134 as illustrated in FIG. 12B. However, in this modification, as illustrated in FIG. 12B, the sidewall insulation film 254 also functions as a mask when forming the impurity region 114, and a gap exists between the impurity region 114 and the nitride film 252 in a planar view.

Accordingly, in a case in which silicon oxide is used for the sidewall insulation film 254, if a process for removing the natural oxide film is performed to form the silicide layer on the impurity region 114, the sidewall insulation film 254 may retreat, the silicide layer may contact the first semiconductor region 115s and the second semiconductor region 115d, and thus, a junction leakage may be increased. Therefore, in a case in which the silicon oxide is used for the sidewall insulation film 254, it is preferable to form the impurity region 114 before forming the sidewall insulation film 254, that is, it is preferable to form the impurity region 114 prior to forming the impurity region 124 and the impurity region 134.

In a case of using the silicon nitride for the sidewall insulation film 254, because the sidewall insulation film 254 does not retreat at a time of removal of the natural oxide film, it is possible to avoid a contact between the silicide layer and each of the first semiconductor region 115s and the second semiconductor region 115d.

Impurities contained in the impurity regions 114 (source region 114s and the drain region 114d) are not particularly limited. Alternatively, arsenic may be used; however, phosphorus is preferable.

Next, a characteristic test of a memory transistor performed by the inventors will be described.

In a first characteristic test, a plurality of memory transistors were fabricated according to the first embodiment while changing an impurity concentration of the second semiconductor region 115d, and the program operation and the erase operation of 10,000 cycles were performed on their operations, and a window of a current change was measured after a baking treatment at 200° C. for 24 hours. A result is depicted in FIG. 13.

In FIG. 13, a horizontal axis represents an impurity concentration of the second semiconductor region 115d, that is, a phosphorus concentration in this case, and a vertical axis represents a ratio of a read current difference between a program state and an erase state to a standard deviation σ of the read current of each of the plurality of memory transistors. As illustrated in FIG. 13, if the impurity concentration is $5 \times 10^{17}$ cm$^{-3}$ or less, the window of 5σ or more is obtained. Therefore, the impurity concentration of the second semiconductor region 115d is preferably $5 \times 10^{17}$ cm$^{-3}$ or less.

In the second characteristic test, while changing the impurity concentration of the LDD region 113 (the first semiconductor region 115s), the plurality of memory transistors were fabricated according to the first embodiment, and the current change by the program operation was measured for the plurality of memory transistors. A result is depicted in FIG. 14.

In FIG. 14, 5 horizontal axis represents an impurity concentration of the first semiconductor region 115s, that is, an arsenic concentration in this case, and a vertical axis represents a current value after the program operation in a case in which the current value is 1 before the program operation. As illustrated in FIG. 14, if the impurity concentration is $3 \times 10^{19}$ cm$^{-3}$ or more, the current value hardly changes before and after the program operation. Therefore, the impurity concentration of the first semiconductor region 115s is preferably $3 \times 10^{19}$ cm$^{-3}$ or more. That is, it is apparent that making the impurity concentration of the first semiconductor region 115s larger than the impurity concentration of the second semiconductor region 115d is an essential requirement for improving durability (endurance).

In a third characteristic test, a junction leakage current was measured while changing an impurity concentration of the LDD region 113 (the first semiconductor region 115s). A result is illustrated in FIG. 15.

Figure 15:
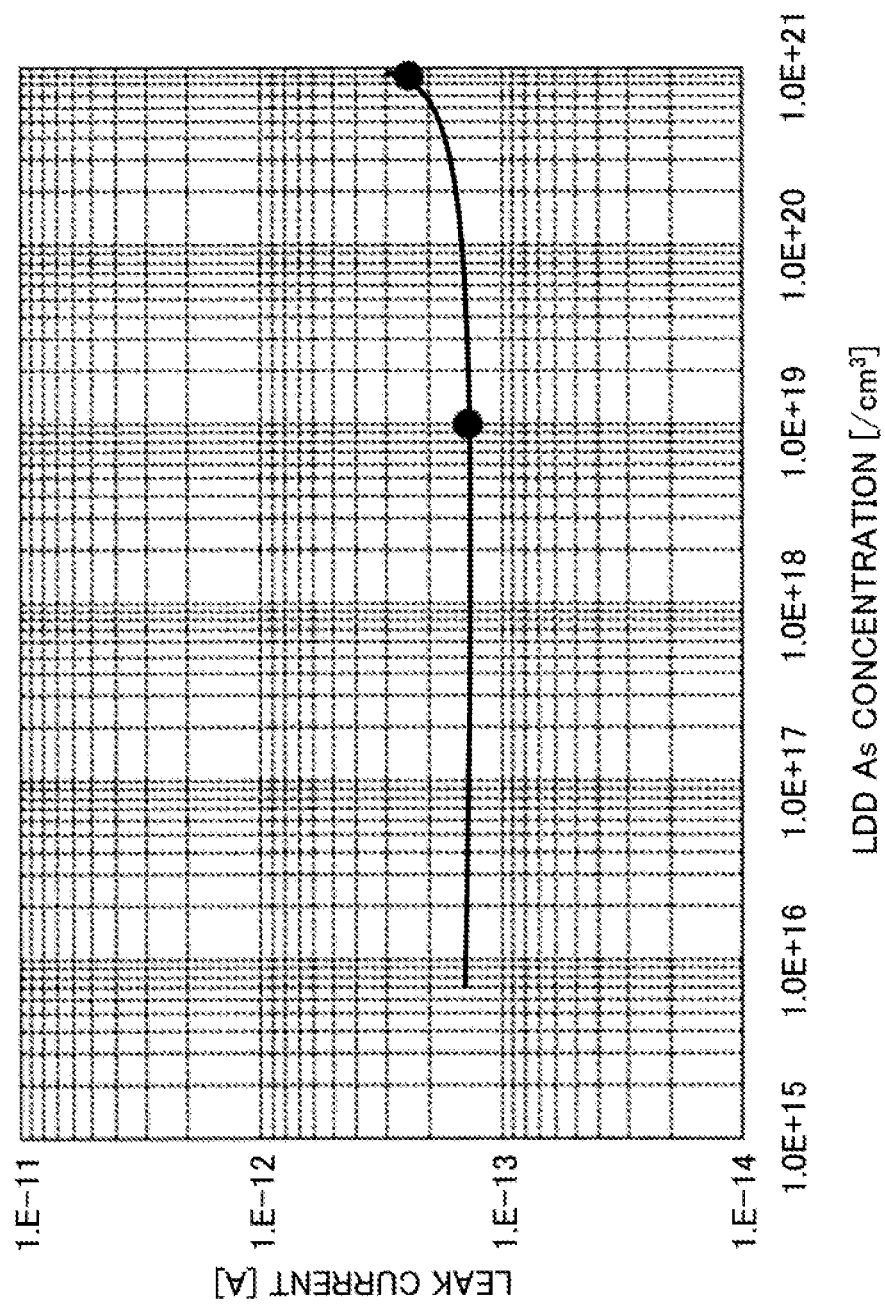
FIG. 15 is a graph illustrating a relationship between a relationship between the impurity concentration and a leak current.

In FIG. 15, a horizontal axis represents an impurity concentration of the first semiconductor region 115s, that is, an arsenic concentration in this case, and a vertical axis represents a leak current. As illustrated in FIG. 15, if the impurity concentration is $5 \times 10^{20}$ cm$^{-3}$ or less, the leak current is controlled to be low. Therefore, the impurity concentration of the first semiconductor region 115s is preferably $5 \times 10^{20}$ cm$^{-3}$ or less.

Figure 16:
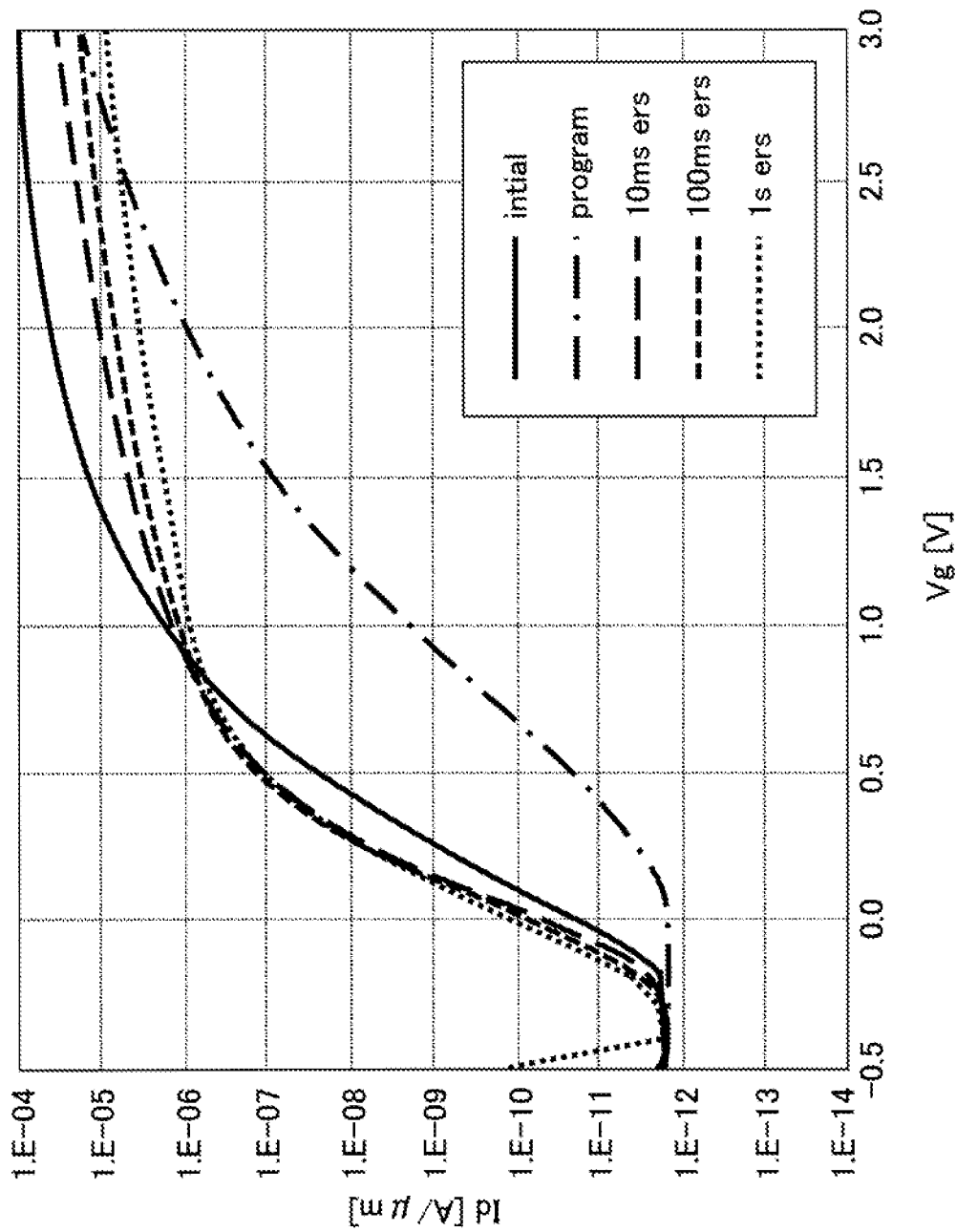

In a fourth characteristic test, arsenic or phosphorus was contained in the source region 114s and the drain region 114d, and a change in a read current Id due to the erase operation was measured. A result in a case of containing the arsenic is depicted in FIG. 16, and a result in a case of containing phosphorus is depicted in FIG. 17. FIG. 16 and FIG. 17 illustrate a relationship between a gate voltage Vg [V] and the read current Id [A/μm] obtained by the read operation before and after the program operation and after the erase operation.

The program operation for the memory transistor 10 is performed with both the source region 114s and the semiconductor substrate 101 set at 0V, the gate electrode 211 and the drain region 114d set at 4V (program voltage Vp=4V), and a program time Tp set as 1 μs. In the erase operation after the program operation, both the source region 114s and the semiconductor substrate 101 are set to 0V, the gate electrode 211 is set to −5V, the drain region 114d is set to 5V (erase voltage Ve=5V), and an erase time Te is set to 10 ms, 100 ms, and 1 sec. In the read operation before and after programming and after the erase operation, the drain region 114d and the semiconductor substrate 101 are set to 0V, and a predetermined voltage is applied to the gate electrode 211 and 0.5V (drain voltage Vd-0.5V) is applied to the source region 114s. K relationship between the gate voltage Vg and the read current Id during this read operation is illustrated in FIG. 16 and FIG. 17.

When the program operation is performed under the condition of program voltage Vp=4V and program time Tp–1 μs, the threshold voltage after the program operation shifts to higher Vg than a voltage (initial threshold voltage) before the program operation.

In a case in which the erase operation is performed on the memory transistor 10 after the program operation under a condition of the erase voltage Ve=5V and the erase time 1 sec, as illustrated in FIG. 16 and FIG. 17, the characteristic becomes different depending on the impurities contained in the source region 114s and the drain region 114d. That is, in the case in which the arsenic is contained (FIG. 16), current deterioration occurs on the high Vg; however, in a case in which the phosphorus is included (FIG. 17), the current deterioration accompanying the erase operation is small and the junction leakage is small as compared with the case in which the arsenic is contained. Therefore, the impurity contained in the impurity region 114 (the source region 114s and the drain region 114d) is preferably phosphorus rather than arsenic.

According to the first to fourth embodiments, it is possible to obtain more excellent endurance against the program operation and the erase operation.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:
1. A semiconductor device, comprising:
a gate insulation film provided above a semiconductor substrate;
a gate electrode provided above the gate insulation film;
a first sidewall insulation film provided on each of sidewalls of the gate electrode and above the semiconductor substrate, wherein the first sidewall insulation film includes a silicon oxide film and a silicon nitride film on the silicon oxide film;
a second sidewall insulation film provided on sidewalls of the silicon nitride film;
a source region and a drain region provided in the semiconductor substrate on both sides of the gate electrode, respectively, the source region and the drain region containing first conductive impurities, wherein in a plan view, an edge of the source region directed to the gate electrode coincides with a first outer edge of the silicon nitride film formed on one side of the gate electrode, an edge of the drain region directed to the gate electrode coincides with a second outer edge of the silicon nitride film formed on another side of the gate electrode, and the second sidewall insulation film overlaps a part of the source region and a part of the drain region;

a first semiconductor region provided in the semiconductor substrate below a first portion of the sidewall insulation film, a location of the first portion being on a source region side with respect to the gate electrode, the first semiconductor region having a concentration of the first conductive impurities lower than that of the source region and that of the drain region;

a second semiconductor region provided in the semiconductor substrate below a second portion of the sidewall insulation film, a location of the second portion being on a drain region side with respect to the gate electrode, the second semiconductor region having a concentration of the first conductive impurities lower than those of the drain region and the first semiconductor region;

a channel region provided in the semiconductor substrate between the first semiconductor region and the second semiconductor region; and a third semiconductor region provided in the semiconductor substrate under the channel region and including second conductive impurities, which are higher in concentration than the channel region and are different from the first conductive impurities, wherein information is stored by accumulating charges in the sidewall insulation film, and the first semiconductor region and the second semiconductor region contact the third semiconductor region with bottom surfaces in a depth direction.

2. The semiconductor device as claimed in claim 1, wherein the concentration of the second conductive impurities in the third semiconductor region is lower than the concentration of the first conductive impurities in the first semiconductor region and is higher than the concentration of the first conductive impurities in the second semiconductor region.

3. The semiconductor device as claimed in claim 1, wherein the concentration of the first conductive impurities in the second semiconductor region is one tenth or less than the concentration of the second conductive impurities in the third semiconductor region.

4. The semiconductor device as claimed in claim 1, wherein the concentration of the first conductive impurities in the first semiconductor region is $3\times10^{19}$ cm$^{-3}$ or more and $5\times10^{20}$ cm$^{-3}$ or less.

5. The semiconductor device as claimed in claim 1, wherein the concentration of the first conductive impurities in the second semiconductor region is $5\times10^{17}$ cm$^{-3}$ or less.

6. The semiconductor device as claimed in claim 1, wherein the second semiconductor region is a non-doped region.

7. The semiconductor device as claimed in claim 1, wherein the third semiconductor region contacts the source region and the drain region.

8. The semiconductor device as claimed in claim 1, wherein the source region and the drain region contain phosphorus as the first conductive impurities.

9. The semiconductor device as claimed in claim 1, further comprising:

a fourth semiconductor region provided in the semiconductor substrate below the third semiconductor region and having a concentration of the second conductive impurities lower than that of the third semiconductor region, a fifth semiconductor region provided in the semiconductor substrate below the fourth semiconductor region and having a concentration of the second conductive impurities higher than that of the fourth semiconductor region.

10. The semiconductor device as claimed in claim 1, wherein the third semiconductor region contacts a side surface of the source region and a side surface of the drain region.

11. The semiconductor device as claimed in claim 1, wherein the first semiconductor region is shallower than the source region in the depth direction, and the second semiconductor region is shallower than the drain region in the depth direction.

12. The semiconductor device as claimed in claim 11, wherein a bottom surface of the third semiconductor region is shallower than bottom surfaces of the source region and the drain region.

13. The semiconductor device as claimed in claim 1, wherein the first conductive impurities are n-type impurities.

14. The semiconductor device as claimed in claim 1, wherein an outer edge of the second sidewall insulation film coincides with an outer edge of the gate insulation film.

15. The semiconductor device as claimed in claim 1, wherein the second sidewall insulation film comprises silicon oxide.

* * * * *